(12) United States Patent
Mohite et al.

(10) Patent No.: US 10,770,239 B1
(45) Date of Patent: Sep. 8, 2020

(54) HIGH-EFFICIENCY AND DURABLE OPTOELECTRONIC DEVICES USING LAYERED 2D PEROVSKITES

(71) Applicant: Triad National Security, LLC, Los Alamos, NM (US)

(72) Inventors: Aditya Mohite, Los Alamos, NM (US); Hsinhan Tsai, Los Alamos, NM (US); Wanyi Nie, Los Alamos, NM (US); Mercouri Kanatzidis, Evanston, IL (US); Konstantinos Stoumpos, Chicago, IL (US)

(73) Assignee: TRIAD NATIONAL SECURITY, LLC, Los Alamos, NM (US)

( * ) Notice: Subject to any disclaimer, the term of this patent is extended or adjusted under 35 U.S.C. 154(b) by 28 days.

(21) Appl. No.: 15/641,142

(22) Filed: Jul. 3, 2017

Related U.S. Application Data

(60) Provisional application No. 62/357,928, filed on Jul. 1, 2016.

(51) Int. Cl.
| | |
|---|---|
| *C30B 29/32* | (2006.01) |
| *C30B 11/00* | (2006.01) |
| *H01G 9/20* | (2006.01) |
| *H01L 51/00* | (2006.01) |
| *H01L 51/42* | (2006.01) |
| *H01L 51/44* | (2006.01) |

(52) U.S. Cl.
CPC ......... *H01G 9/2059* (2013.01); *H01L 51/004* (2013.01); *H01L 51/005* (2013.01); *H01L 51/0037* (2013.01); *H01L 51/0047* (2013.01); *H01L 51/0003* (2013.01); *H01L 51/0026* (2013.01); *H01L 51/4253* (2013.01); *H01L 51/448* (2013.01)

(58) Field of Classification Search
CPC ..... H01L 51/0575–0595; H01L 51/005; H01L 51/0003; H01L 51/0026; H01L 51/4253; H01L 51/448
See application file for complete search history.

(56) References Cited

U.S. PATENT DOCUMENTS

2015/0129034 A1* 5/2015 Snaith ................ H01L 51/4213
136/258
2016/0329162 A1* 11/2016 Qin ........................ C09K 11/06

* cited by examiner

*Primary Examiner* — Tucker J Wright
*Assistant Examiner* — Wilner Jean Baptiste
(74) *Attorney, Agent, or Firm* — Lewis Roca Rothgerber Christie LLP

(57) ABSTRACT

A thin film for an optoelectronic device includes a layered 2D perovskite material. The thin film including the layered 2D perovskite material forms a substantially or nearly single-crystalline highly uniform thin film with strongly preferential out-of-plane alignment of the inorganic perovskite layers. This single-crystalline, highly uniform, and highly aligned thin film of the layered 2D perovskite material may thereby facilitate efficient charge transport in an optoelectronic device.

7 Claims, 26 Drawing Sheets
(24 of 26 Drawing Sheet(s) Filed in Color)

Hot Cast

As Cast

HIGH-EFFICIENCY AND DURABLE OPTOELECTRONIC DEVICES USING LAYERED 2D PEROVSKITES

CROSS-REFERENCE TO RELATED APPLICATION

This application claims priority to and the benefit of U.S. Provisional Patent Application Ser. No. 62/357,928 filed Jul. 1, 2016 and titled HIGH-EFFICIENCY AND DURABLE OPTOELECTRONIC DEVICES USING LAYERED 2D PEROVSKITES, the entire content of which is incorporated herein by reference.

STATEMENT REGARDING FEDERALLY SPONSORED RESEARCH OR DEVELOPMENT

The United States government has certain rights in this invention pursuant to Contract No. DE-AC52-06NA25396 between the United States Department of Energy and Los Alamos National Security, LLC for the operation of Los Alamos National Laboratory.

BACKGROUND

Three-dimensional (3D) organic-inorganic perovskites are promising thin film materials for optoelectronic devices due to their remarkable photophysical properties. For example, in solar cells, 3D perovskite materials have shown power conversion efficiencies exceeding 20%, with the prospect of further improvements towards the Shockley-Queisser limit for a single-junction solar cell. However, a lack of environmental stability (e.g., to moisture) and photostability under operating conditions are critical factors against the use of 3D perovskite materials in photovoltaics and other optoelectronic applications. In addition, anomalous hysteresis effects have greatly reduced reproducibility in these devices.

Layered two-dimensional (2D) perovskite films, such as Ruddlesden-Popper phase perovskites, have shown promising stability in optoelectronic applications. However, they have shown poor power conversion efficiencies of only 4.73%. This may be attributed to inhibition of out-of-plane charge transport by organic cations, which act like insulating spacing layers between the conducting inorganic components. Accordingly, the efficiencies of these layered 2D perovskite materials has limited their applicability in optoelectronic applications.

SUMMARY

According to embodiments of the present invention, a thin film for an optoelectronic device includes a layered 2D perovskite material comprising one or more inorganic perovskite layers, the layered 2D perovskite material comprising a substantially single-crystalline uniform thin film with preferential out-of-plane alignment of the inorganic perovskite layers.

In some embodiments, the layered 2D perovskite material may be represented by Formula 1:

$$A_2B_{n-1}M_nX_{3n+1}.\qquad\text{Formula 1}$$

In Formula 1, A may be a first organic or inorganic cation, B may be a second organic or inorganic cation, M may be a metal, X may be an anion, and n may be an integer greater than or equal to 1.

In some embodiments, the layered 2D perovskite material represented by Formula 1 may be represented by $(BA)_2(MA)_{n-1}Pb_nI_{3n+1}$, wherein BA is an n-butyl ammonium cation and MA is a methyl ammonium cation.

In some embodiments, in Formula 1, n may be 3 or 4.

In some embodiments, the thin film may have a thickness of 100 nm to 900 nm.

According to embodiments of the present invention, a method of making a thin film for an optoelectronic device includes dissolving a layered 2D perovskite material in a solvent to prepare a perovskite solution; heating the perovskite solution under continuous stirring at a first temperature for a first time period; preheating a substrate at a second temperature for a second time period to prepare a heated substrate; transferring the heated substrate to a spin-coating chunk; depositing a first volume of the perovskite solution onto the heated substrate; and spin-coating the first volume of the perovskite solution onto the heated substrate at a spin speed for a third time period.

In some embodiments, the solvent used to prepare the perovskite solution may be N,N-dimethylformamide or N-methyl-2-pyrrolidone.

In some embodiments, the second temperature to which the substrate is heated may be 30° C. to 150° C.

In some embodiments, the spin speed used for spin-coating the first volume of the perovskite solution onto the heated substrate may be 3,000 rpm to 6,000 rpm.

According to embodiments of the present invention, an optoelectronic device includes a substrate layer, a thin film including a layered 2D perovskite on the substrate layer, the layered 2D perovskite comprising one or more inorganic perovskite layers, and the thin film comprising a substantially single-crystalline uniform thin film with preferential out-of-plane alignment of the inorganic perovskite layers, and a second electrode on the thin film.

In some embodiments, the optoelectronic device may further include an electron transport layer.

In some embodiments, the optoelectronic device may further include an encapsulation layer.

In some embodiments, the optoelectronic device may be a photovoltaic device, a solar cell, a LED, a LASER, an electrically injected LASER, a photo or charge particle detector, or a field effect transistor.

BRIEF DESCRIPTION OF THE DRAWINGS

The patent or application file contains at least one drawing executed in color. Copies of this patent or patent application publication with color drawings will be provided by the Office upon request and payment of the necessary fee.

These and other features and advantages of the present invention will be better understood by reference to the following detailed description when considered in conjunction with the accompanying drawings.

DETAILED DESCRIPTION

Figure 1:
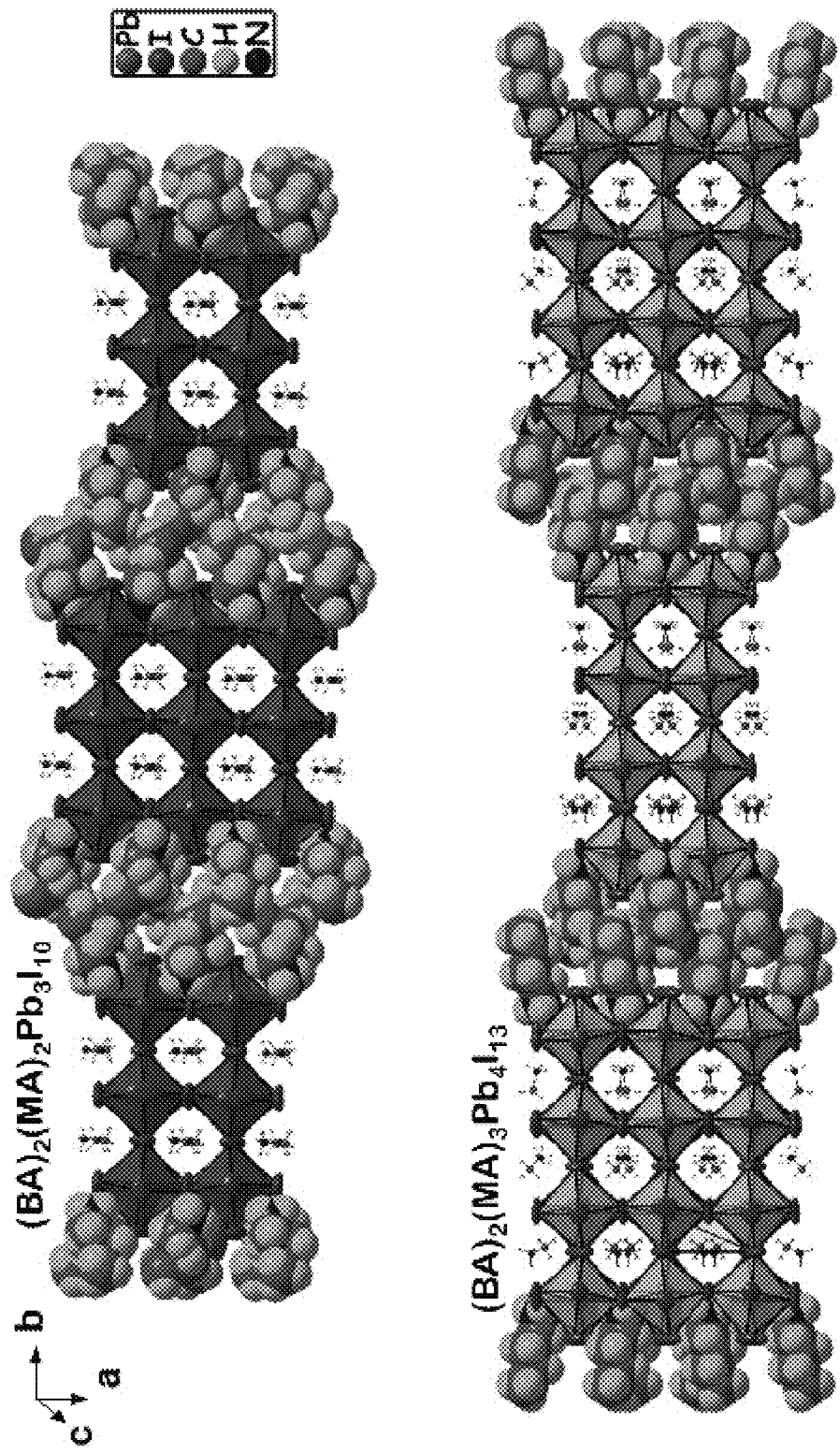
FIG. 1 depicts a space-filling crystal structure drawing of Ruddlesden-Popper $(BA)_2(MA)_2Pb_3I_{10}$ and $(BA)_2(MA)_3Pb_4I_{13}$ layered perovskites, according to embodiments of the present invention. The inorganic perovskite regions of the respective materials include three red or four teal perovskite octahedra (layers) in the direction along (e.g., parallel to) the b-axis. Each octahedron includes a lead cation (Pb, green) at its center and an iodide anion (I, purple) at each of its six vertices. Methyl ammonium (MA) cations composed of carbon (C, red), hydrogen (H, green), and nitrogen (N, blue) are intercalated between the octahedra so that the number of cations is one less than the number of octahedra along the b-axis. The cationic regions of both materials include two butyl ammonium (BA) cations in the direction along the b-axis composed of carbon (C, red), hydrogen (H, green), and nitrogen (N, blue). The structure substantially repeats itself along the a and c directions.

Aspects of embodiments of the present invention may be understood by reference to Tsai, H. et al., "High-efficiency two-dimensional Ruddlesden-Popper perovskite solar cells", *Nature*, 2016, 536, 312-216, the entire content of which is incorporated herein by reference.

According to one or more embodiments of the present invention, a thin film for an optoelectronic device includes a layered two-dimensional (2D) perovskite material including one or more inorganic perovskite regions (layers) and one or more cation regions (layers). The inorganic perovskite regions and the cation regions may be arranged in an alternating configuration or structure, in which each inorganic perovskite region is positioned between two cation layers, and/vice versa. As used herein, the term "inorganic perovskite layers" refers to layer-shaped regions of the two-dimensional (2D) perovskite material including one or more perovskite unit cells and having perovskite chemistry, and the term "cation layers" refers to layer-shaped regions of the two-dimensional (2D) perovskite material including one or more cation-containing unit cells and having cationic chemistry. According to embodiments of the present invention, the thin film including the layered 2D perovskite material may be a substantially single-crystalline or nearly single-crystalline material, enabling the film to be highly uniform with preferential (and in some embodiments strongly preferential) out-of-plane alignment of the inorganic perovskite layers. Such a single-crystalline, highly uniform, and highly oriented and aligned thin 2D perovskite film may thereby facilitate efficient charge separation and transport when used in an optoelectronic device.

As used herein, the term "uniform", "uniformity", and like terms as used to describe the perovskite thin film indicate that qualities such as thickness, composition, alignment, coverage, structure, etc. are substantially the same over the total area of the thin film.

As used herein, the terms "substantially" and "nearly" are used as terms of approximation and not as terms of degree, and are intended to account for the inherent inaccuracies in measured, observed or calculated values or qualities. For example, a thin film that is substantially or nearly single-crystalline denotes a thin film that functions in a manner consistent with or comparable to a truly single-crystalline film, and that exhibits chemical, physical and/or optoelectrical properties on par with or comparable to a truly single-crystalline film.

Similarly, as used herein, the terms "highly oriented", "highly aligned", "highly uniform," and like terms are not used as terms of degree, and are instead intended to denote the unusually high (and thus different) level of orientation, alignment, and uniformity of the films according to embodiments of the present invention when compared with comparable films known to those of ordinary skill in the art. For example, as will be discussed in further detail, thin films made with similar perovskite materials but according to a different method may exhibit lower levels of crystal orientation and alignment and film uniformity than thin films made according to the methodologies according to embodiments of the present invention. The relative degrees of orientation, alignment, and/or uniformity may be ascertained from comparative experimental results using characterization techniques such as Grazing-Incidence Wide-Angle X-ray Scattering (GIWAXS) and Scanning Electron Microscopy (SEM), which will be discussed further. In such an instance, the films according to embodiments of the present invention, as defined herein, are considered "highly" oriented, "highly aligned", and "highly" uniform, i.e., since they are more oriented, aligned, and uniform than the comparable film of similar material composition.

The terms "aligned" and "alignment" are used in their art-recognized sense to describe the perovskite thin film and to refer to the rotational positioning of crystals of the 2D perovskite material with respect to an underlying substrate. For example, a crystal of the perovskite material may be aligned so that a particular crystal plane is parallel to the planar surface of a substrate (e.g., the angle between the planes is 0°). In some embodiments, for example, a highly aligned material has a large proportion of crystals and/or unit cells (i.e., with respect to the entire population of crystals and/or units cells in the thin film) having the same (shared) rotational position with respect to the substrate, as would be understood or recognized by those of ordinary skill in the art. In some embodiments, for example, a highly aligned material has a large proportion of crystals and/or unit cells that are rotationally positioned so that the same crystal plane of each is parallel to the planar surface of a substrate. In some embodiments, for example, the crystals and/or units cells of a highly aligned material may be more than 50% aligned with each other and the substrate, for example, 70% to 99% aligned, 80% to 95% aligned, or 85% to 90% aligned.

The terms "oriented" and "orientation" are used in their art-recognized sense to describe the perovskite thin film refer to the positioning of unit cell regions (e.g., domains) of the 2D perovskite material with respect to each other. For example, when two unit cell regions of the 2D perovskite material have the same or substantially same orientation (i.e. no, or a negligible number of, discontinuities due to rotation, translation, or inversion of one region with respect to the other), the two unit cell regions form one continuous or substantially continuous domain. In some embodiments, for example, a highly oriented material includes larger crystal domains and fewer grain boundaries (discontinuities), as would be understood or recognized by those of ordinary skill in the art. In some embodiments, for example, the crystals and/or units cells of a highly oriented material may be more than 50% oriented with each other, for example, 70% to 99% oriented, 80% to 95% oriented, or 85% to 90% oriented.

As used herein, the term "out-of-plane" refers to a direction perpendicular to a planar or substantially planar surface, for example, the planar surface of a flat substrate. The term "out-of-plane", as used to describe the alignment of a material in a layer, refers to the alignment of planes of adjacent crystals and/or unit cells along a direction perpendicular to the plane of the substrate, with respect to the substrate.

As discussed above, the thin film according to embodiments of the present invention includes a layered 2D perovskite material. The thin film may include any suitable layered 2D perovskite material (i.e., material having a 2D perovskite structure), for example, a Ruddlesden-Popper phase perovskite, an Aurivillius phase perovskite, and/or a Dion-Jacobson phase perovskite.

In some embodiments, the 2D perovskite material may be a Ruddlesden-Popper phase perovskite. The layered 2D perovskite material may be represented by Formula 1:

$$A_2B_{n-1}M_nX_{3n+1}.$$  Formula 1

In Formula 1, A is a first organic or inorganic cation, B is a second organic or inorganic cation, M is a metal (e.g., a metal cation), X is an anion, and n is an integer greater than or equal to 1.

In some embodiments, the first organic or inorganic cation A may be included in the cationic regions (layers) and may act as a spacer between perovskite regions (layers). Furthermore, the cation A may be a sterically bulky cation to confine perovskite growth to two dimensions. However, any suitable cation may be used as A.

The term "sterically bulky" is used according in its art-recognized sense to refer to a molecule, group, or cation having an effective volume (as determined by the space taken up by its constituent atoms) that excludes the presence of other molecules or groups in the same unit cell, plane, radius, etc. due to repulsion between the electron clouds of the molecules or groups.

In some embodiments, A may be an inorganic cation including an alkali metal (e.g., Na, K, Rb, and Cs), an alkaline earth metal (e.g., Mg, Ca, Sr, and Ba), and/or a lanthanide metal (e.g. La, Nd, Sm, Eu, Gd, Dy).

In some embodiments, A may be an organic cation, such that the layered 2D perovskite material represented by Formula 1 is an organic-inorganic hybrid. For example, A may be an organic cation including a Group V non-metal such as nitrogen (N) and/or phosphorus (P) bonded to one or more carbon-containing groups.

In some embodiments, A may be an organic cation including a N atom that is protonated, alkylated, or arylated with a suitable number of substituents so that it bears a positive formal charge. The substituents of the N atom are not particularly limited, and may be selected from alkyl groups, aryl groups, heteroalkyl groups, and heteroaryl groups. In some embodiments, the substituents may be coupled or bonded to the N atom via a single bond or a double bond. In some embodiments, two or more substituents may be coupled or bonded to each other to form a ring.

In some embodiments, A may be a primary, secondary, or tertiary aliphatic alkylammonium cation or a primary, secondary, or tertiary aromatic alkylammonium cation. In some embodiments, A may be a primary alkylammonium cation represented by the general formula $H_3NR_1^+$. When A is a primary aliphatic alkylammonium cation, the $R_1$ group of the cation may be an alkyl group, for example, a methyl group, an ethyl group, a propyl group, an isopropyl group, an n-butyl group, a t-butyl group, etc. When A is a primary aromatic alkylammonium cation, the $R_1$ group of the cation may be an aryl group, for example, a phenyl group, a naphthyl group, a biphenyl group, etc. In some embodiments, A may be a primary aliphatic alkylammonium cation including an n-butyl group, such that A is an n-butyl ammonium cation.

In some embodiments, the second organic or inorganic cation B in Formula 1 may be included in the perovskite regions (layers). The second organic or inorganic cation B may be intercalated between adjacent metal-anion ($MX_6$) octahedra. In some embodiments, the second organic or inorganic cation B may be an inorganic cation including an alkali metal (e.g., Na, K, Rb, and Cs), an alkaline earth metal (e.g., Mg, Ca, Sr, and Ba), or a lanthanide metal (e.g. La, Nd, Sm, Eu, Gd, Dy).

In some embodiments, B may be an organic cation containing a Group V non-metal such as N and/or P. In some embodiments, B may be an organic cation including a N atom that is protonated, alkylated, or arylated with a suitable number of substituents so that it bears a positive formal charge. The substituents of the N atom are not particularly limited, and may be selected from alkyl groups, aryl groups, heteroalkyl groups, and heteroaryl groups. In some embodiments, the substituents may be coupled or bonded to the N atom via a single bond or a double bond. In some embodiments, two or more substituents may be coupled or bonded to each other to form a ring.

For example, B may be an amidinium cation such as formamidinium.

In some embodiments, B may be a primary, secondary, or tertiary aliphatic alkylammonium cation or a primary, secondary, or tertiary aromatic alkylammonium cation. In some embodiments, B may be a primary alkylammonium cation represented by the general formula $H_3NR_2^+$. In some embodiments, when B is a primary aliphatic alkylammonium cation, the $R_2$ group of the cation may be an alkyl group, for example, a methyl group, an ethyl group, a propyl group, an isopropyl group, an n-butyl group, a t-butyl group, etc. In some embodiments, when B is a primary aromatic alkylammonium cation, the $R_2$ group of the cation may be an aryl group, for example, a phenyl group, a naphthyl group, a biphenyl group, etc. In some embodiments, B may be a primary aliphatic alkylammonium cation including a methyl group, such that B is a methyl ammonium cation.

In some embodiments, the metal M in Formula 1 may be included in the perovskite regions (layers) and may be positioned in the centers of perovskite octahedra. In some embodiments, the metal M may be a transition metal or a main group metal, non-limiting examples of which may include first-row transition metals (e.g., Sc, Ti, V, Cr, Mn, Fe, Co, Ni, Cu, and/or Zn), second-row transition metals (e.g., Y, Zr, Nb, Mo, Tc, Ru, Rh, Pd, Ag, and/or Cd), third-row transition metals (e.g., Hf, Ta, W, Ru, Os, Ir, Pt, Au, and/or Hg), and main group metals (e.g., Al, Ga, In, Sn, Tl, Pb, B, and/or Po). In some embodiments, M may be Sn and/or Pb.

In some embodiments, the anion X in Formula 1 may be included in the perovskite regions (layers) and may be positioned at the corners of the perovskite octahedra. In some embodiments, the anion X may be a halide anion (e.g., Cl, Br, and/or I) and/or a chalcogenide anion (e.g., O and/or S). In some embodiments, X may be iodide.

In some embodiments, in Formula 1, M may be Pb and X may be I, such that the thin film includes one or more lead-iodide inorganic perovskite layers.

In some embodiments, in the layered 2D perovskite represented by Formula 1, A is n-butyl ammonium (BA), B is methyl ammonium (MA), M is Pb, and X is iodide (I), such that the thin film includes a layered 2D perovskite of the $(BA)_2(MA)_{n-1}Pb_nI_{3n+1}$ perovskite family. Here, $\{(MA)_{n-1}Pb_nI_{3n+1}\}^{2-}$ denotes the anionic inorganic layer derived from the parent 3D perovskite, methylammonium lead triiodide ($MAPbI_3$).

In Formula 1, n is an integer greater than or equal to 1 and refers to the number of contiguously stacked perovskite octahedra in the inorganic perovskite layers. For example, FIG. 1 shows a space-filling crystal structure drawing of the Ruddlesden-Popper $(BA)_2(MA)_2Pb_3I_{10}$ (n=3) and $(BA)_2(MA)_3Pb_4I_{13}$ (n=4) layered 2D perovskites. Here, groups of 3 (red) and 4 (teal) perovskite octahedra, respectively, are stacked along the b axis and intercalated by 2 and 3 (i.e., n−1) MA cations, respectively, to form the inorganic perovskite layers. The inorganic perovskite layers are isolated from each other by the organic n-butylammonium (BA) spacer cation regions, and are interposed with $(BA)_2$ cation layers along the b axis. In FIG. 1, each perovskite octahedron includes a lead (Pb, green) cation at its center and an iodide anion (I, purple) at each of its six vertices. The atoms forming the MA and BA cations are color-coded as carbon (C, red), hydrogen (H, green), and nitrogen (N, blue).

When n→∞, the crystal structure and optoelectronic properties of the 2D layered perovskite material become substantially similar to that of the parent 3D perovskite. Accordingly, n may be selected to tune the desired optoelectronic properties of the 2D layered perovskite material. For example, the 2D layered perovskite materials and the parent 3D perovskite are known to be semiconductor materials. Density Functional Theory (DFT) computations predict that 2D $(BA)_2(MA)_{n-1}Pb_nI_{3n+1}$ compounds have a direct bandgap and that the gap energies are inversely correlated with the number of stacked octahedra in the inorganic perovskite layer. Accordingly, the band-gap energy ($E_g$) can be tuned experimentally between 1.52 eV (n=∞) to 2.24 eV (n=1).

Figure 2A:
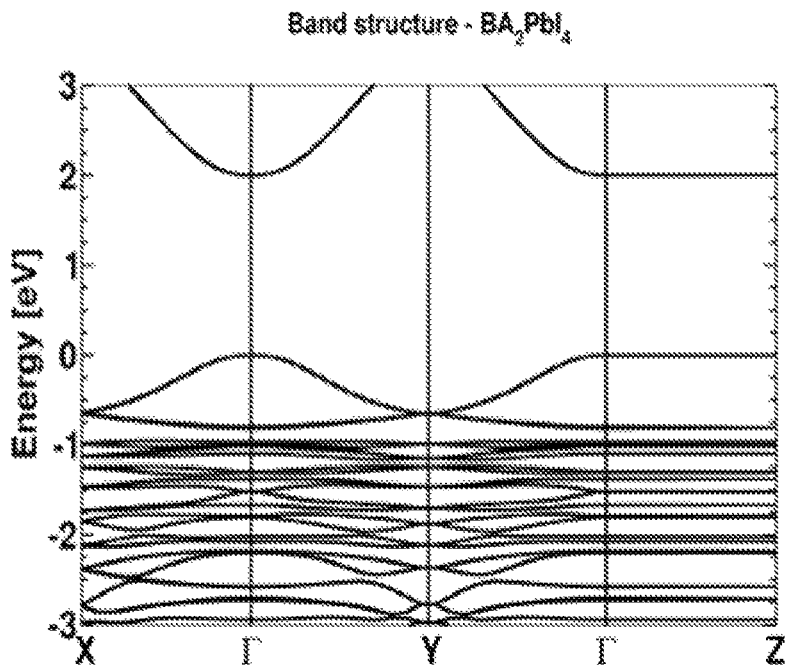
FIGS. 2a and 2b depict the electronic band structures of $(BA)_2(MA)_3Pb_4I_{13}$ and $(BA)_2(MA)_2Pb_3I_{10}$, respectively, as calculated using density functional theory (DFT) with a local-density approximation, according to embodiments of the present invention.
Figure 2B:
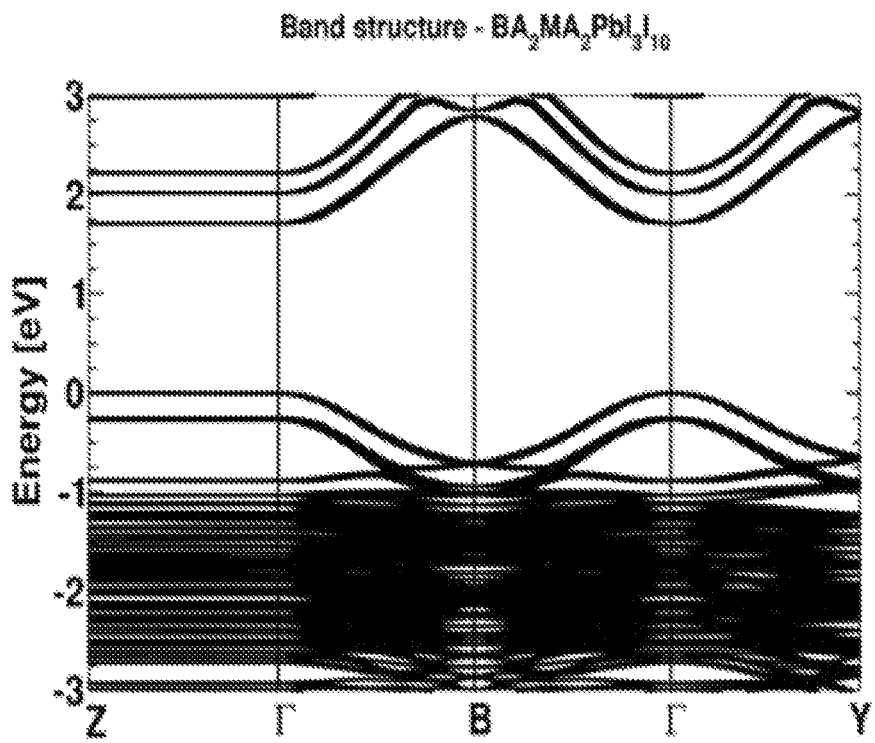

FIGS. 2a and 2b depict the electronic band structures of $(BA)_2(MA)_3Pb_4I_{13}$ (n=1; a) and $(BA)_2(MA)_2Pb_3I_{10}$ (n=3; b), calculated using DFT with a local-density approximation, including the spin-orbit coupling and a bandgap correction computed using the HSE (Heyd-Scuseria-Ernzerhof) functional. The energy levels are referenced to the valence band maximum ($E_{VB}$=0 eV).

In some embodiments, n may be an integer selected from 1 to 20. In some embodiments, n may be an integer selected from 1 to 15, 2 to 10, 2 to 7, or 2 to 5, and in some embodiments, n may be an integer selected from 3 to 4.

For the $(BA)_2(MA)_2Pb_3I_{10}$ (n=3) and $(BA)_2(MA)_3Pb_4I_{13}$ (n=4) layered 2D perovskites, the exciton binding energy should be closer to that of $MAPbI_3$ (n=∞, parent 3D perovskite), in which the excitons are expected to be almost ionized at room temperature, and charge carrier transport is accordingly expected to be dominated by free carriers.

The layered 2D perovskites may be synthesized using any suitable starting material and/or process. For example, the ammonium cations used as A and B in Formula 1 may be synthesized by acidifying the respective amines with hydroiodic acid (HI) to produce ammonium iodide salts. In some embodiments, when A is an n-butyl ammonium cation and B is a methyl ammonium cation, A and B may be produced by acidifying aqueous solutions of n-butyl amine and methylamine. An example synthetic procedure is described in Cao, D. H. et al., "2D Homologous Perovskites as Light-Absorbing Materials for Solar Cell Applications", Journal of the American Chemical Society 2015, 137 (24), 7843-7850, the entire content of which is incorporated herein by reference.

The thickness of the inorganic perovskite layers (e.g., the number of adjacent n between cation regions) within the 2D layered perovskite material can be incrementally adjusted by control of the stoichiometry.

Throughout this specification, any data pertaining to a "layered 2D perovskite", "2D perovskite", or "perovskite thin film" for which the formula is not specified refer to $(BA)_2(MA)_3Pb_4I_{13}$ (n=4) unless otherwise noted.

A thin film for an optoelectronic device may be formed using any suitable technique, including spin coating, spray coating, ink-jet printing, dip-coated, etc. In some embodiments, the thin film for an optoelectronic device may be formed at an elevated temperature or under heating conditions, such as those associated with a hot-casting process.

According to embodiments of the present invention, a hot-casting process for making a single-crystalline, highly uniform, and highly aligned thin film of a layered 2D perovskite material for an optoelectronic device includes: dissolving the layered 2D perovskite material in a solvent to prepare a perovskite solution; heating the perovskite solution under continuous stirring at a first temperature for a first time period; simultaneously preheating a substrate at a second temperature for a second time period to prepare a heated substrate; transferring the heated substrate (e.g., immediately, or within 5 seconds) to a spin-coating chunk; depositing a first volume of the perovskite solution onto the heated substrate (e.g., immediately depositing); and spin-coating the perovskite solution onto the heated substrate at a spin speed for a third time period.

The hot-casting process may overcome the above-mentioned efficiency issues in layered perovskites by producing near single-crystalline quality thin films with a strongly preferential out-of-plane alignment of the inorganic perovskite component to facilitate efficient charge transport. As used herein, "hot-cast" or "hot-casting" refers to spin-coating on a substrate that has been heated to a temperature above room temperature (e.g., above 30° C.).

Figure 3A:
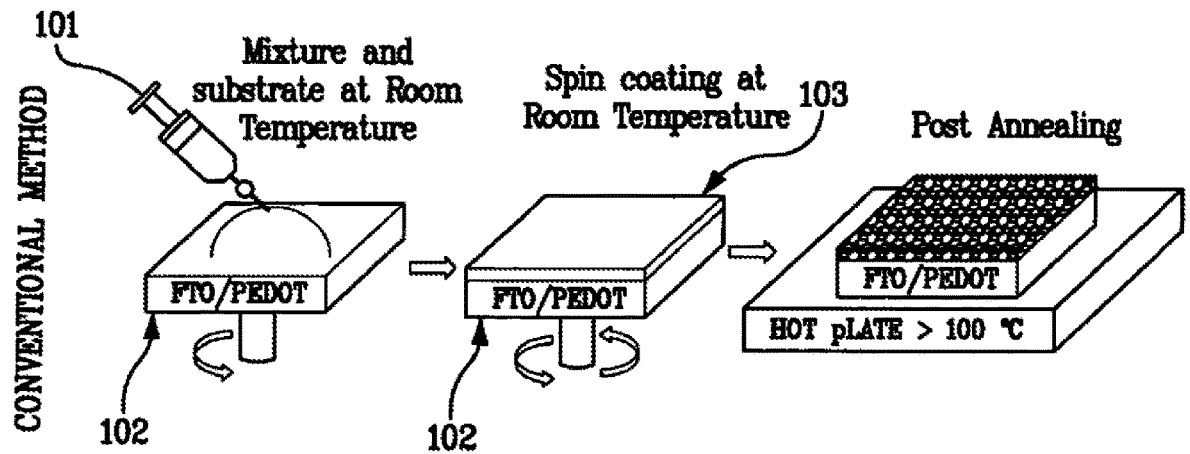
FIG. 3a shows a process diagram for spin-coating for a conventional spin-coating process used to prepare thin films. According to the conventional process, a solution of the desired material is mixed and deposited onto the substrate at room temperature. The substrate is spin-coated at room temperature and allowed to dry, and the spin-coated substrate is subsequently post-annealed on a hot plate to form the finished film.

FIG. 3a is a diagram showing a conventional spin-coating process used to prepare thin films. According to this conventional spin-coating process, a solution of the desired material is mixed and deposited onto the substrate at room temperature. The substrate is spin-coated at room temperature and allowed to dry, and the spin-coated substrate is subsequently post-annealed on a hot plate (e.g., at a temperature>100° C.) to form the finished film.

Figure 3B:
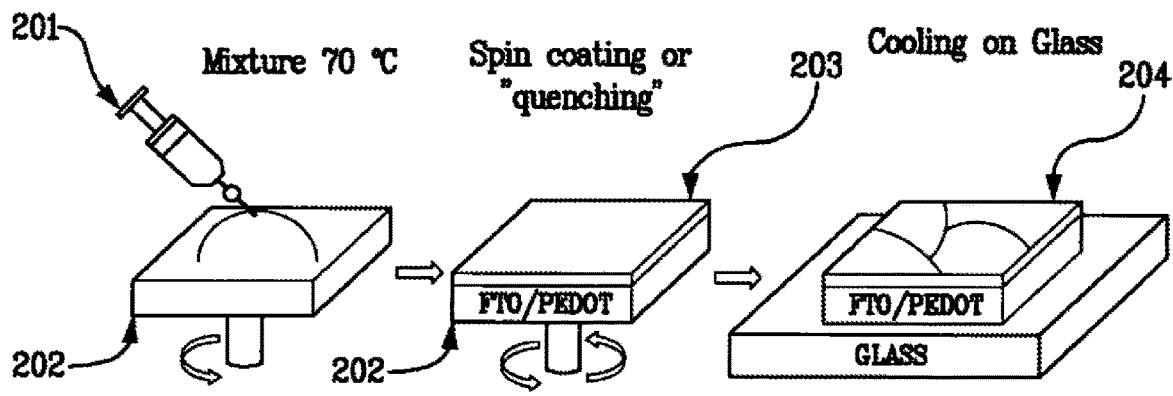
FIG. 3b shows a process diagram for hot-casting thin films according to embodiments of the present invention. According to this process, a solution of the desired material is heated to a first temperature and the substrate is heated (e.g., simultaneously) to a second temperature, where both the first and second temperatures are elevated above room temperature. The substrate is spin-coated or "quenched" at this second temperature and allowed to cool and dry, thus forming the finished film.

FIG. 3b is a diagram showing a hot-casting process for the preparation of thin films according to embodiments of the present invention. According to the hot-casting process, a solution of the desired material is heated to a first temperature (e.g., 50-150° C., or 70° C.) and the substrate is heated (e.g., simultaneously) to a second temperature (e.g., 30-150° C.), where both the first and second temperatures are elevated above room temperature. The substrate is spin-coated at this second temperature and allowed to cool and dry, thus forming the finished film.

The substrate may be any suitable substrate for an optoelectronic device. An example substrate may include a transparent conductive oxide (such as fluorine doped tin oxide (FTO), indium tin oxide (ITO), and/or indium zinc oxide (IZO)) coated with a polymer (such as poly(3,4-ethylenedioxythiophene):polystyrene sulfonate (PEDOT:PSS)).

According to embodiments of the present disclosure, the second temperature at which the substrate may be heated is 30° C. to 150° C., and in some embodiments, 80° C. to 140° C., and in some embodiments, 100° C. to 120° C.

The solvent used to prepare the perovskite solution may be any suitable solvent. Solvents with a higher boiling point, such as N,N-dimethylformamide (DMF, boiling point=153° C.) and N-methyl-2-pyrrolidone (NMP, boiling point=203° C.) may be employed to increase the amount of time that the solvent is retained during the spin-coating. When the perovskite solution is maintained above the crystallization temperature of the perovskite during the spin-coating process, the continued presence of the solvent may enable the perovskite crystals to continue growing to a larger grain size. The first temperature at which the solution may be heated is 50° C. to 150° C., and in some embodiments, 60° C. to 100° C., for example, 70° C. The solution may be heated for a first time period of 5 min to 30 min, and in some embodiments, 10 min to 20 min.

The concentration of the perovskite solution to be spin-coated onto the heated substrate may be 0.115 M to 1.8 M based on the moles of the metal M in Formula 1 (e.g., in the case of a Pb-containing perovskite, moles of $Pb^{2+}$ cations), for example, 0.118 M to 0.9 M, and in some embodiments, 0.118 M to 0.45 M. The concentration of the perovskite solution determines the thickness of the resulting thin film, with higher concentrations resulting in thicker films. The thin film including a layered 2D perovskite may have a thickness of 100 nm to 900 nm, for example, 150 nm to 450 nm, and in some embodiments, 200 to 300 nm. While thicker films may enhance light harvesting, the charge transport properties of the film may limit the overall efficiency of an optoelectronic device including the thin film. Accordingly, the thickness of the thin film may be suitably chosen to balance these two effects.

Any suitable volume of perovskite solution may be used as long as it is able to coat (e.g., uniformly coat) a thin film on a substrate of a sufficient area for use in the optoelectronic device. The volume of the perovskite solution to be spin-coated onto the heated substrate may be 50 μL to 200 μL, in some embodiments, 70 μL to 150 μL, and in some embodiments, 80 μL to 100 μL.

The spin speed and the third time period used in spin-coating the perovskite solution onto the heated substrate may be appropriately selected according to their effects on the quality (e.g., uniformity) of the thin film and the time required to evaporate the solvent. For example, the first spin speed may be 3,000 rpm to 6,000 rpm, and in some embodiments, 4,000 to 5,000 rpm. The third time period may be 10 s to 30 s, and in some embodiments, 15 s to 20 s.

According to embodiments of the present invention, an optoelectronic device includes a substrate layer, a thin film including a layered 2D perovskite on the substrate layer, and a second electrode on the thin film. The thin film including the layered 2D perovskite material forms a substantially or nearly single-crystalline highly uniform thin film with preferential out-of-plane alignment of the inorganic perovskite layers. As used herein, when an element such as a layer, film, region, or substrate is referred to as being "on" another element, it may be directly on the other element, or intervening element(s) may also be present. In contrast, when an element is referred to as being "directly on" another element, no intervening elements are present.

The substrate may include a first electrode layer and a hole transporting layer. The first electrode layer and hole transporting layer may include or be formed of any suitable materials. For example, the substrate may include a transparent conductive oxide (such as fluorine doped tin oxide (FTO), indium tin oxide (ITO), and/or indium zinc oxide (IZO)) as the first electrode layer, and a poly(3,4-ethylenedioxythiophene):polystyrene sulfonate (PEDOT:PSS) layer as the hole transporting layer. When the thin film including the layered 2D perovskite material is aligned between two electrodes (e.g., the first electrode layer and the second electrode), photogenerated charges or electrically generated charges may be easily transported throughout the film.

The second electrode may be formed of any suitable conductive material, including a transparent and conductive material (such as ITO, FTO, or IZO) and a metal (such as Al, Au, Ag, or Pt). The second electrode may be deposited using any suitable method. When the second electrode is a metal, the metal may be deposited using thermal evaporation.

In some embodiments, the optoelectronic device may further include an electron transport layer. The electron transport layer may be formed of any suitable electron transporting material, and in some embodiments, may include [6,6]-phenyl-C61-butyric acid methyl ester (PCBM). The electron transporting material may be deposited using any suitable deposition method, such as, for example, spin-coating.

In some embodiments, the optoelectronic device may further include an encapsulation layer. The encapsulation layer may substantially seal the device and prevent or reduce exposure of the thin film to atmospheric moisture during operation. The encapsulation layer may be formed of any suitable encapsulating material. In some embodiments, the encapsulation layer may be a layer of glass that is attached to the top of the device using a glue or epoxy, such as, for example, a ultraviolet (UV) curable epoxy.

In some embodiments, the optoelectronic device may be a photovoltaic device such as a solar cell, a LED, a LASER (e.g., an electrically injected LASER), a photo or charge particle detector, a field effect transistor, etc.

The following examples and experimental data are provided for illustrative purposes only, and do not limit the scope of the embodiments of the present invention.

Examples 1 to 7 and Comparative Example 1: Thin Film Fabrication and Characterization Poly(3,4-ethylenedioxythiophene):polystyrene sulfonate (PEDOT:PSS), methylamine hydrochloride (MACl), methylamine solution (MA, 40% in $H_2O$), hydriodic acid (HI, 57 wt % in $H_2O$), hypophosphorous acid ($H_3PO_2$, 50% in $H_2O$), lead oxide powder (PbO), n-butylamine (n-$CH_3(CH_2)_3NH_2$, BA, 99%), and N,N-dimethylformamide (DMF, anhydrous) were purchased from Sigma-Aldrich. All the materials were used as received without further purification.

Raw 2D layered perovskite materials were prepared by combining PbO, MACl and BA in appropriate ratios in a $H_1/H_3PO_2$ solvent mixture, as described in Cao, D. H. et al., "2D Homologous Perovskites as Light Absorbing Materials for Solar Cell Applications," Journal of the American Chemical Society, 137 (24), 7843-7850 (2015), the entire content of which is incorporated herein by reference. For example, for $(BA)_2(MA)_3Pb_4I_{13}$, 4 equivalents of PbO powder was dissolved in a mixture of aqueous HI solution and $H_3PO_2$ by heating to boiling under constant stirring for about 5 min, forming a bright yellow solution. 2 equivalents of MACl were added to the yellow solution, causing initial precipitation of a powder that rapidly redissolved under stirring to afford a clear bright yellow solution. 2 equivalents of BA were then added dropwise under vigorous stirring over a period of 1 min. Stirring was then discontinued and the solution was left to cool to room temperature. Deep-red rectangular-shaped plates were allowed to crystallize over ~2 h, and subsequently isolated by filtration. For $(BA)_2(MA)_2Pb_3I_{10}$, 3 equivalents of PbO powder was used instead of 4 equivalents. Solutions of $(BA)_2(MA)_2Pb_3I_{10}$ and $(BA)_2(MA)_3Pb_4I_{13}$ were prepared at molar concentrations of 1.8 M, 0.9 M, 0.45 M, 0.225 M and 0.118 M of $Pb^{2+}$ cation in anhydrous DMF. While the 0.225 M $Pb^{2+}$ solution is used in the example embodiments described herein, it will be understood that those of ordinary skill in the art are capable of selecting, preparing, and utilizing other suitable solutes and solution concentrations according to the principles described herein.

FTO/PEDOT:PSS substrates were prepared by cleaning FTO glasses using soapy water in an ultra-sonication bath, rinsing with distilled water, acetone, and isopropyl alcohol, and finally treating with oxygen plasma for 3 min. PEDOT:PSS layers were then spin coated onto each of the FTO substrates at 5,000 rpm for 45 sec as hole transporting layers (HTL). The coated substrates were then transferred to an Argon filled glovebox.

The 2D perovskite solution including $Pb^{2+}$ cations as a concentration of 0.225 M in DMF was heated under continuous stirring at 70° C. for 30 minutes. The FTO/PEDOT:PSS substrates were preheated at temperatures between 30° C. to 150° C. on a hot plate for 10 minutes prior to spin coating. These were immediately (within 5 sec) transferred to the hot FTO/PEDOT:PSS substrates on the spin coater chunk (chunk is at room temperature) and 80 μL of precursor solution was dropped onto the hot substrate. The spin coater was immediately started with a spin speed of 5,000 rpm for 20 sec without ramp. The thin film color turned from pale yellow to brown within a few seconds as the solvent evaporated. The spin coater was stopped, and the substrates were quickly removed from the spin coater.

A similar hot-casting method is described in Nie, W. et al., "High-efficiency solution-processed perovskite solar cells with millimeter-scale grains", *Science*, Jan. 30, 2015, 522-525, the entire content of which is incorporated herein by reference.

The 2D perovskite thin film examples and comparative examples were prepared as summarized in Table 1:

| Example | Perovskite | Substrate temperature |
|---|---|---|
| Example 1 | $(BA)_2(MA)_3Pb_4I_{13}$ | 50° C. |
| Example 2 | $(BA)_2(MA)_3Pb_4I_{13}$ | 70° C. |

-continued

| Example | Perovskite | Substrate temperature |
|---|---|---|
| Example 3 | $(BA)_2(MA)_3Pb_4I_{13}$ | 90° C. |
| Example 4 | $(BA)_2(MA)_3Pb_4I_{13}$ | 110° C. |
| Example 5 | $(BA)_2(MA)_3Pb_4I_{13}$ | 130° C. |
| Example 6 | $(BA)_2(MA)_3Pb_4I_{13}$ | 150° C. |
| Example 7 | $(BA)_2(MA)_2Pb_3I_{10}$ | 110° C. |
| Comparative Example 1 | $(BA)_2(MA)_3Pb_4I_{13}$ | RT (30° C.) |

Figure 4:
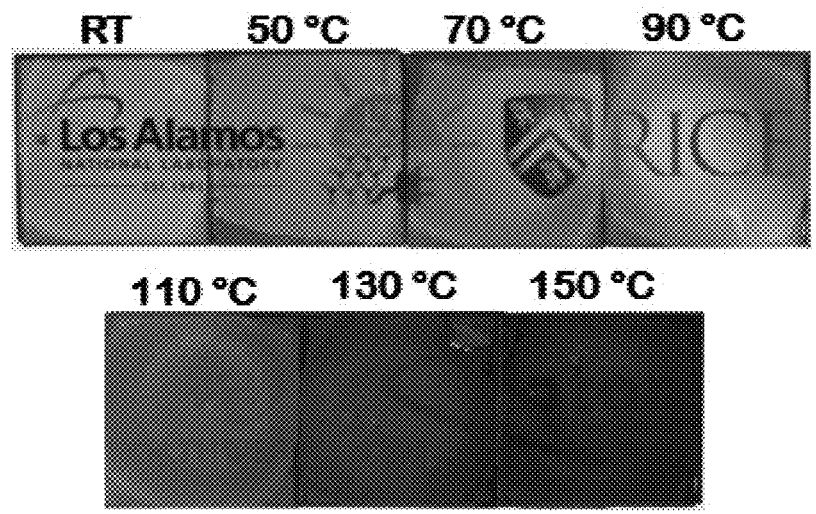
FIG. 4 is an optical photograph of $(BA)_2(MA)_3Pb_4I_{13}$ perovskite thin films prepared according to Comparative Example 1 (room temperature, RT, 30° C.) and Examples 1 to 6 (50° C. to 150° C., described in the Examples section. The tiles are heated to the temperature shown above each tile and a $(BA)_2(MA)_3Pb_4I_{13}$ perovskite thin film is deposited at that temperature.

FIG. 4 is an optical photograph of $(BA)_2(MA)_3Pb_4I_{13}$ perovskite thin films deposited on substrates that have been heated to temperatures between RT (30° C.) and 150° C. As shown in FIG. 4, the film color darkens as the second temperature (e.g., the temperature of the preheated substrate) increases. As used herein, "RT" or "room temperature" refers to a temperature of about 30° C.

Figure 5A:
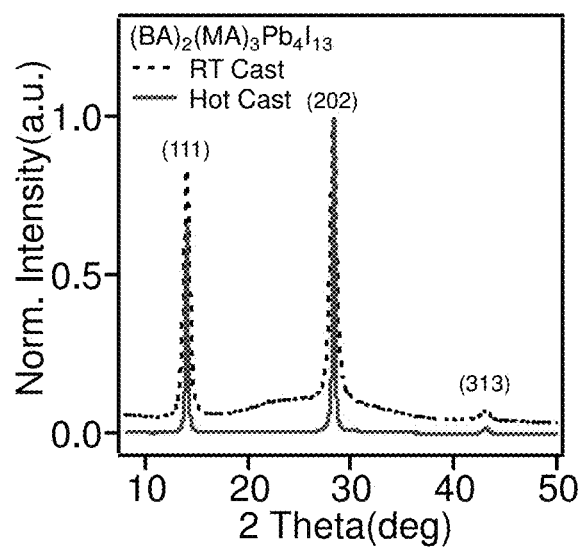
FIG. 5a is a plot comparing the GIXRD spectra for the room temperature (RT) cast $(BA)_2(MA)_3Pb_4I_{13}$ film prepared according to Comparative Example 1 (black line) and the hot-cast $(BA)_2(MA)_3Pb_4I_{13}$ film prepared according to Example 4 at 110° C. (red line), described in the Examples section.

The crystallinity of the $(BA)_2(MA)_3Pb_4I_{13}$ perovskite thin films was investigated using Grazing Incidence X-ray Diffraction (GIXRD). FIG. 5a is a plot comparing the GIXRD spectra for the sample cast at 30° C. ("RT", black) and the sample cast at 110° C. ("hot-cast", red). Three dominant diffraction peaks were observed in both films at 2θ=14.20°, 28.48°, and 43.28°, corresponding to reflections from the $(BA)_2(MA)_3Pb_4I_{13}$ crystallographic planes (111), (202), and (313) respectively. The diffraction background is reduced and the peaks are narrower for the thin film cast at 110° C. compared to the thin film cast at 30° C.

Figure 5B:
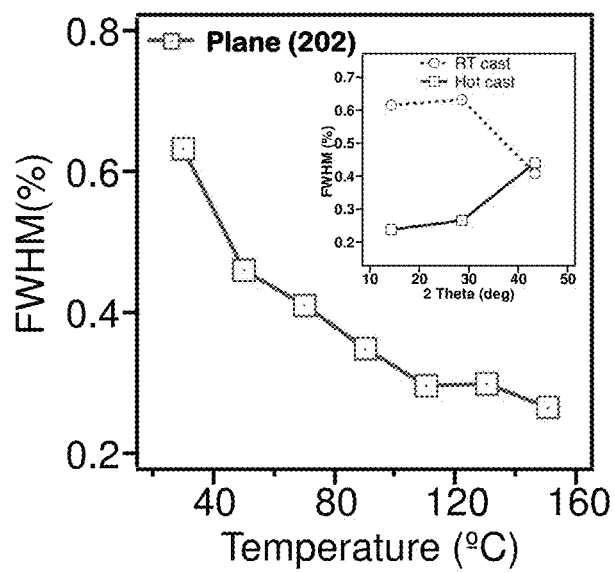
FIG. 5b is a plot comparing the full width at half maximum height (FWHM) of the (202) peak in the GIXRD spectra of $(BA)_2(MA)_3Pb_4I_{13}$ thin films prepared according to Comparative Example 1 and Examples 1 to 6, e.g., as a function of substrate temperature from RT to 150° C. (red line, squares). The graph inset depicts the FWHM (%) for the (111), (202), and (313) planes (peaks) in the room temperature (RT) cast film prepared according to Comparative Example 1 (blue circles with dotted line) and the hot-cast film prepared according to Example 4 at 110° C. (blue squares with solid line).

FIG. 5b is a graph of the full width at half maximum height (FWHM) for the (202) plane peak as a function of hot-casting temperature. The FWHM of the (202) plane is significantly reduced from 0.63° to 0.29° when the casting temperature is increased from 30° C. to at least 110° C., and remains constant at 0.27° for temperatures between 110° C. to 150° C. (red line, squares). The inset is a graph comparing the FWHM for the (111), (202), and (313) planes (peaks) when the casting temperature is 30° C. ("RT", blue circles with dotted line) and 110° C. ("hot-cast", blue squares with solid line). The FWHM of all three peaks are clearly reduced for the hot cast film. These results suggest that the crystallinity of the films increases with temperature, and peaks at 110° C.

Figure 5C:
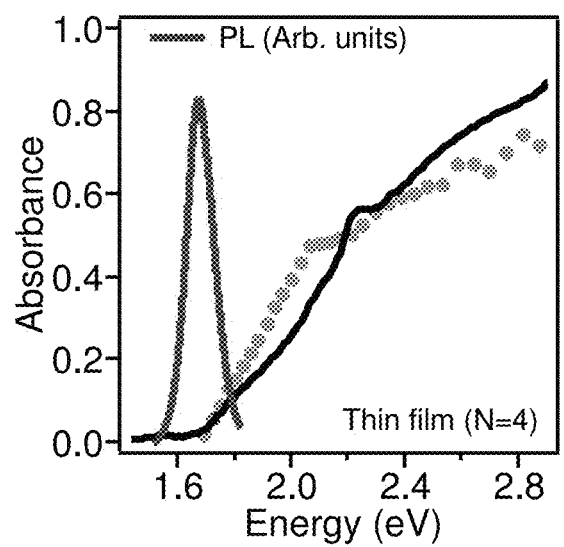
FIG. 5c is a plot of the optical absorbance spectrum of a 370 nm $(BA)_2(MA)_3Pb_4I_{13}$ perovskite thin film prepared according to Example 4 at 110° C., measured in an integrating sphere (grey dots) and with confocal microscopy (black line), along with the photoluminescence spectrum for excitation at 1.96 eV (red line).

FIG. 5c is a plot of the optical absorbance and photoluminescence (PL) spectra of a 370 nm thickness $(BA)_2(MA)_3Pb_4I_{13}$ perovskite thin film at 110° C. The grey circles trace the absorbance of the film as measured in an integrating sphere, and the black line traces the absorbance of the film as measured by confocal microscopy. The photoluminescence spectra for excitation at 1.96 eV is shown in red. The PL and optical absorbance measurements yield band-edge energy of 1.655±0.002 eV and 1.66±0.01 eV, respectively, in good agreement with previous reports. The experimentally measured optical absorption spectra do not exhibit excitonic signatures. Moreover, the apparent lack of Urbach tails of the optical absorption, the very small Stokes-shift, and the strong absorption and photoluminescence indicate that the $(BA)_2(MA)_3Pb_4I_{13}$ perovskite behaves like a direct bandgap intrinsic semiconductor with good crystallinity and very few carrier traps and disorder induced density of states in the band gap.

Figure 5D:
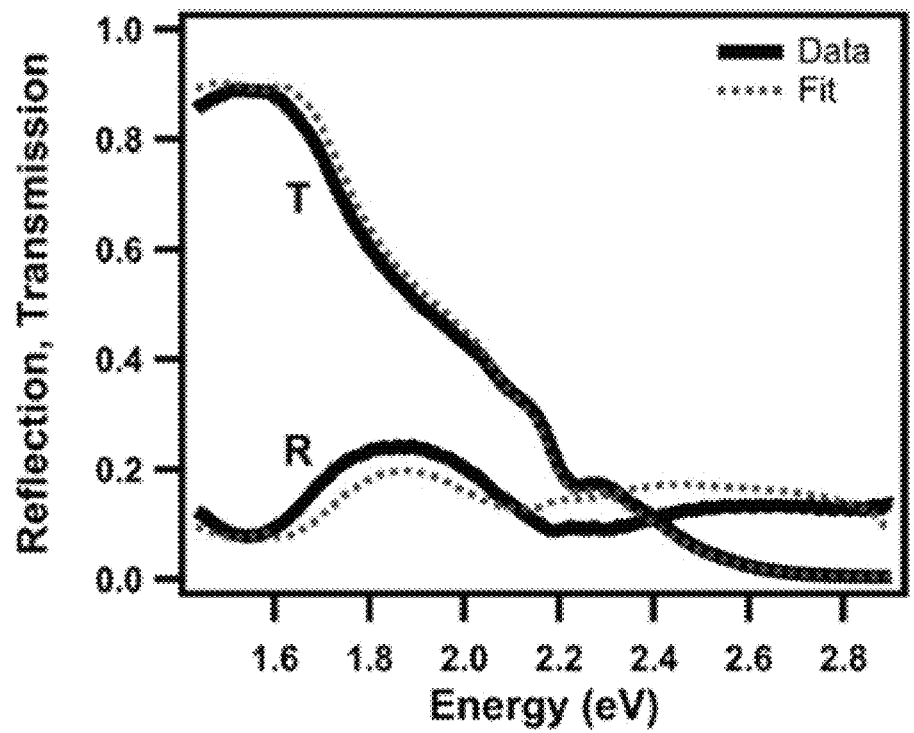
FIG. 5d shows the results of fitting the reflection (R) and transmission (T) data (black lines) for the $(BA)_2(MA)_3Pb_4I_{13}$ perovskite thin film prepared according to Example 4. The red dashed lines show the calculated fits for each data trace.
Figure 5E:
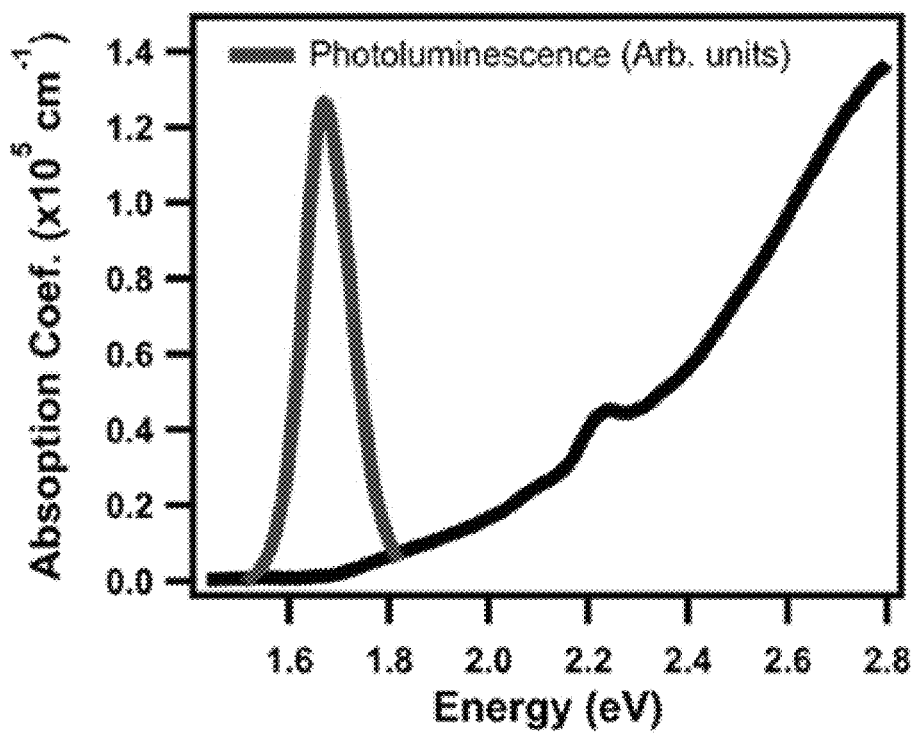
FIG. 5e shows the absolute absorption cross-section (black line) and the photoluminescence spectrum (red line) for the $(BA)_2(MA)_3Pb_4I_{13}$ thin film prepared according to Example 4.
Figure 5F:
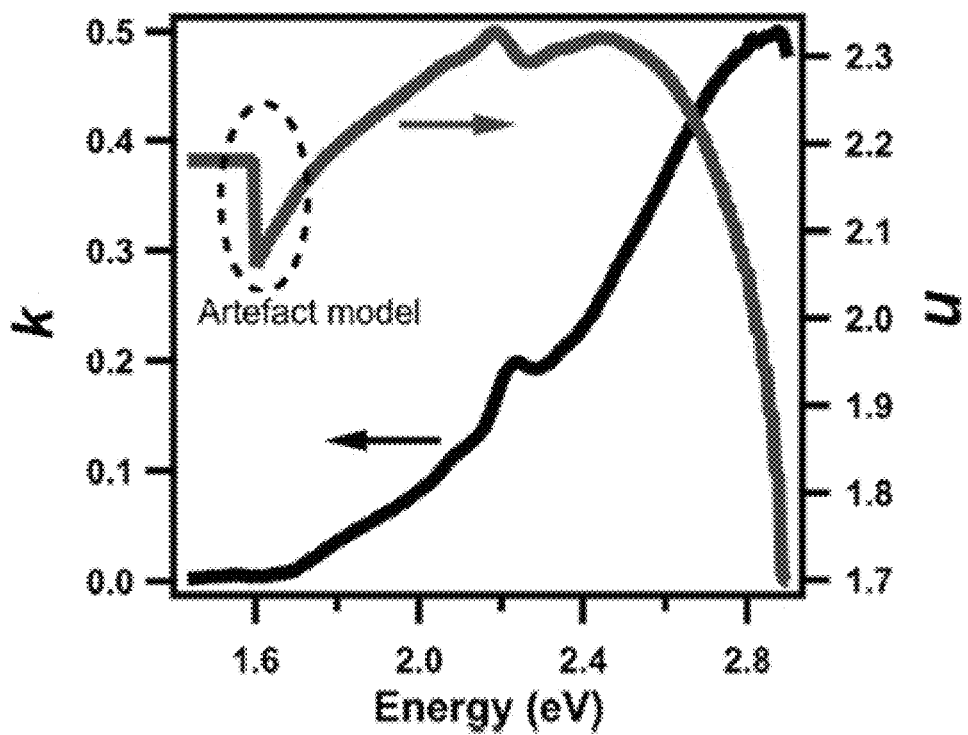
FIG. 5f shows the real (n; red line) and imaginary (k; black line) parts of the refractive index for the $(BA)_2(MA)_3Pb_4I_{13}$ perovskite thin film prepared according to Example 4.
Figure 5G:
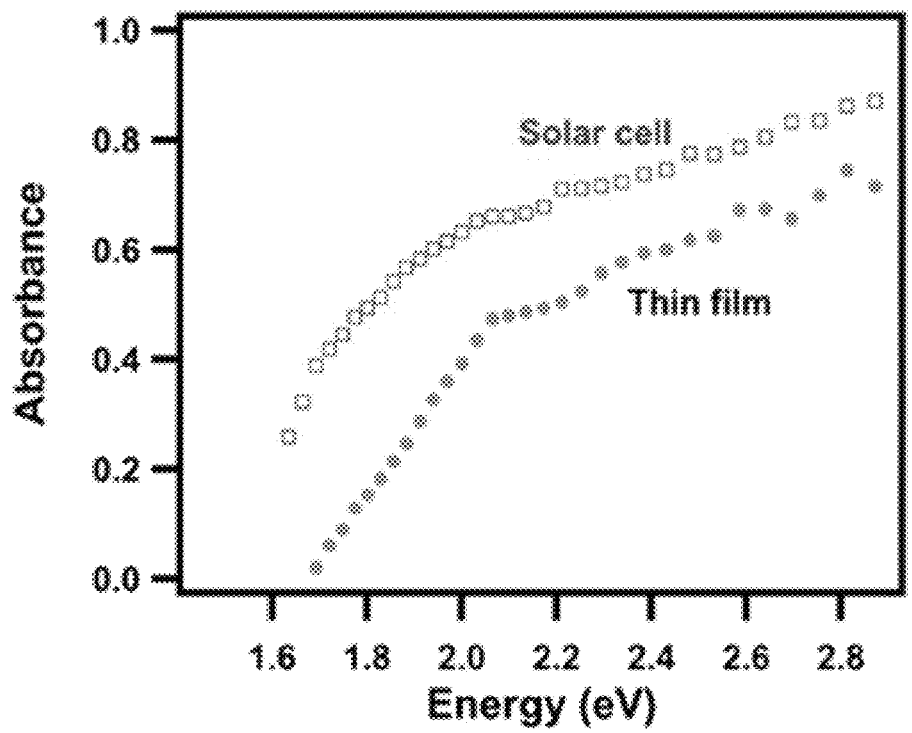
FIG. 5g shows the optical absorbance of the $(BA)_2(MA)_3Pb_4I_{13}$ perovskite thin film prepared according to Example 4 (grey circles) compared to that of optimized solar cells (red squares) measured using integrating sphere techniques.

FIGS. 5d through 5g are graphs showing the local optical absorption characteristics of a $(BA)_2(MA)_3Pb_4I_{13}$ perovskite thin film prepared according to Example 4 (110° C.) using reflection/transmission experimental methods. FIG. 5d shows the reflection (R) and transmission (T) spectra (black lines) for the thin films, along with the data fitting results (red dashed lines). FIG. 5e shows the absolute absorption cross-section. FIG. 5f shows the real (n; red line) and imaginary (k; black line) parts of the refractive index. FIG. 5g shows the absorbance of thin films (grey circles) compared to that of optimized solar cells (red squares) measured using integrating sphere techniques.

In order to probe the perovskite alignment with respect to the substrate in the thin films, a Grazing-Incidence Wide-Angle X-ray Scattering (GIWAXS) analysis was performed using synchrotron radiation. The perovskite alignment from GIWAXS was derived according to the following procedure: The unit vector $\hat{n}$ normal to the substrate surface was defined in the lattice reference frame. The alignment of the crystallites (which are rotationally random around $\hat{n}$) can be inferred from the Miller indices of the plane perpendicular to $\hat{n}$. Two peaks were chosen whose possible set of indices can be inferred from powder diffraction pattern, and for each pair, a system of equations for cosines were solved with respect to the Miller indices of $$\hat{n}: \frac{\hat{n}\cdot\vec{G}}{G} = \cos\theta \equiv \frac{Q_z}{Q},$$

where $Q_z$ and $Q$ were deduced from peak positions in the GIWAXS pattern. Simulated GIWAXS patterns for each pair (performed through the Laue condition $\vec{G}=\vec{Q}$) were compared to the experimental pattern, and the best match was taken as the optimal solution. Accordingly, the (101) plane was deduced to be the Miller plane parallel to the substrate.

Figure 6A:
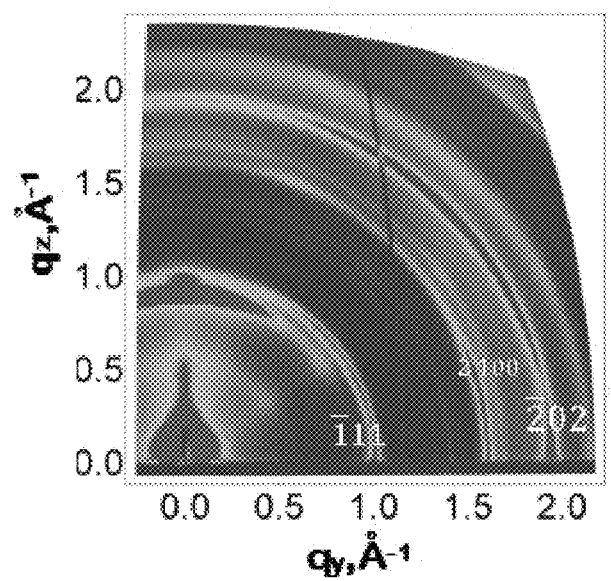
FIG. 6a shows the GIWAXS map for a $(BA)_2(MA)_3Pb_4I_{13}$ perovskite thin film prepared according to Comparative Example 1 (cast at 30° C.). The red regions correspond to peaks of high intensity, while the blue regions correspond to regions of low intensity.

FIG. 6a shows the GIWAXS map for a $(BA)_2(MA)_3Pb_4I_{13}$ perovskite thin film cast at 30° C. The red regions correspond to peaks of high intensity, while the blue regions correspond to regions of low intensity. The thin film exhibits diffraction rings with stronger intensities along certain extended arc segments, which indicates considerable randomness in the 3D orientation of the crystal domains (grains) within the polycrystalline film.

Figure 6B:
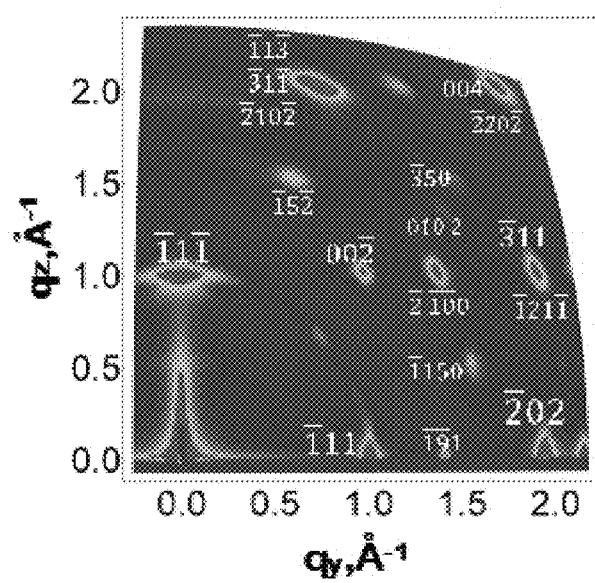
FIG. 6b shows the GIWAXS map for a $(BA)_2(MA)_3Pb_4I_{13}$ perovskite thin film prepared according to Example 4 (cast at 110° C.). The red regions correspond to peaks of high intensity, while the blue regions correspond to regions of low intensity.

FIG. 6b shows the GIWAXS map for a $(BA)_2(MA)_3Pb_4I_{13}$ perovskite thin film cast at 110° C. Again, the red regions correspond to peaks of high intensity, while the blue regions correspond to regions of low intensity. The thin film exhibits sharp, discrete Bragg spots along the same rings, indicating a textured polycrystalline film comprised of relatively few, very large crystallites aligned in the same direction. The observed Bragg reflections in the diffraction pattern were indexing using a simulated diffraction pattern from the orthorhombic structure shown in FIG. 1, and the direct orientation of the perovskite inorganic layers relative to the substrate was determined. The crystal domains are aligned with their (101) planes parallel to the substrate surface (as shown in FIG. 7) with 2D in-plane orientational randomness.

Figure 7:
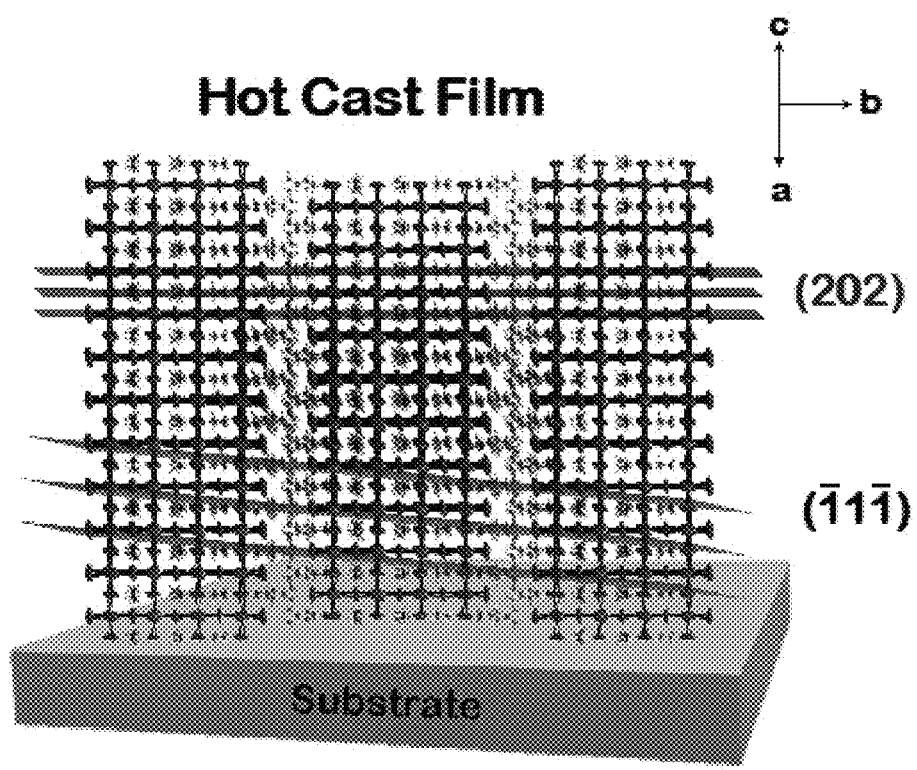
FIG. 7 is a schematic representation of the (101) alignment of the $(BA)_2(MA)_3Pb_4I_{13}$ perovskite thin film crystallites with respect to the substrate (teal block), according to embodiments of the present invention. The grey surfaces and pink surfaces respectively denote the (202) and (111) planes of the perovskite material.

FIG. 7 is a schematic representation of the (101) alignment of the $(BA)_2(MA)_3Pb_4I_{13}$ perovskite thin film crystallites with respect to the substrate. For example the (101) planes of the $(BA)_2(MA)_3Pb_4I_{13}$ perovskite thin film are parallel to the surface of the substrate.

It is apparent from the synchrotron diffraction data that the major perovskite growth direction lies along the (101) plane that is parallel to the $q_z$ direction, as confirmed by the presence of the (−11-1) and (202) spots as the most prominent GIWAXS reflections.

Atomic force microscopy (AFM) and scanning electron microscopy (SEM) were used to compare the morphologies between room temperature-cast and hot-cast films. AFM images were collected using a Bruker Multimode 8. Scanning electron micrographs were obtained using a FEI Quanta 400 F at 10 KeV and spot size=3.5.

Figure 8A:
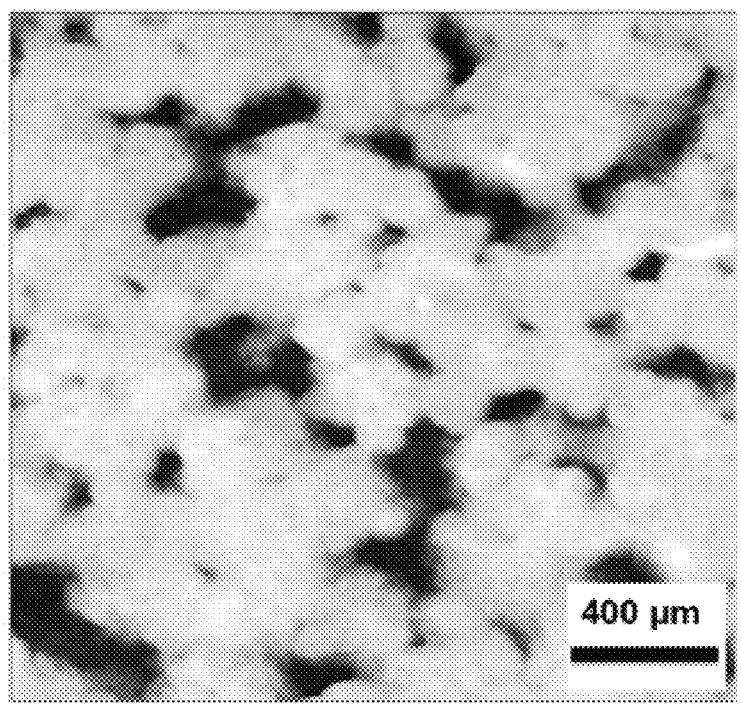
FIGS. 8a and 8b are atomic force microscope (AFM) images showing the surface morphologies of $(BA)_2(MA)_3Pb_4I_{13}$ perovskite thin films prepared according to Comparative Example 1 (cast at 30° C.) and Example 4 (cast at 110° C.), respectively.
Figure 8B:
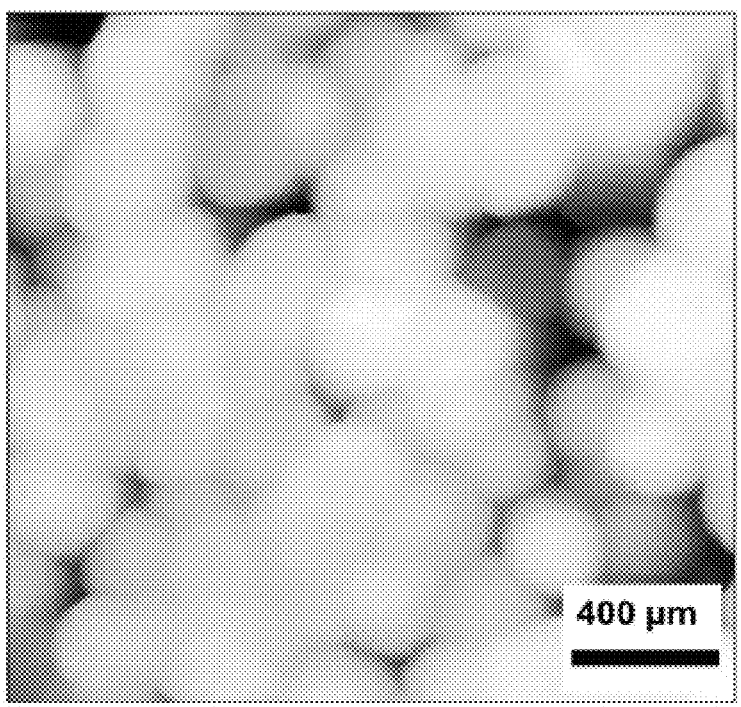

FIGS. 8a and 8b are AFM images showing the surface morphology of $(BA)_2(MA)_3Pb_4I_{13}$ perovskite thin films cast at room temperature (30° C.) and 110° C. The hot-cast films show substantially larger grains (about 400 nm in diameter) in comparison to the room-temperature films (about 150 nm in diameter), resulting in a much more compact and uniform thin film.

Figure 8C:
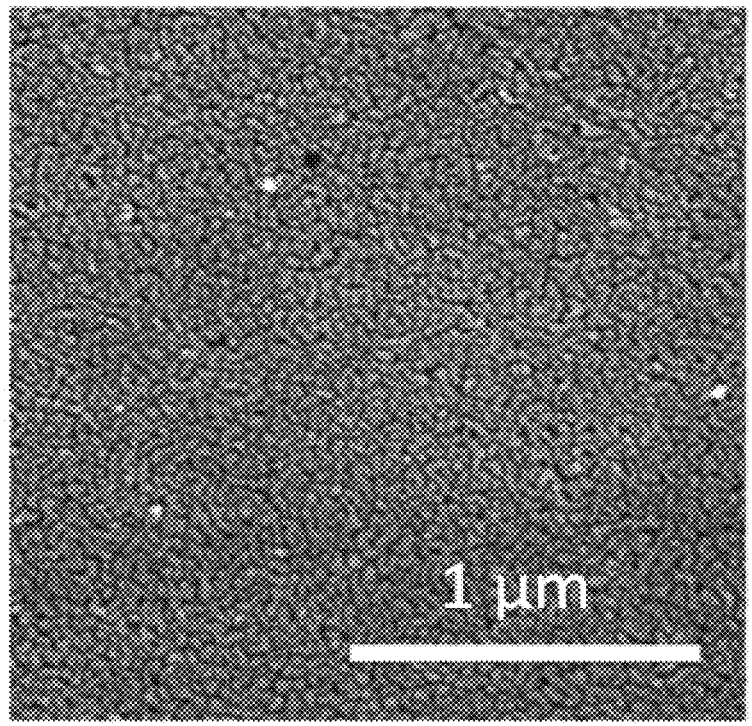
FIGS. 8c and 8d are SEM images showing the topographies of $(BA)_2(MA)_3Pb_4I_{13}$ perovskite thin films prepared according to Comparative Example 1 (cast at 30° C.) and Example 4 (cast at 110° C.), respectively.
Figure 8D:
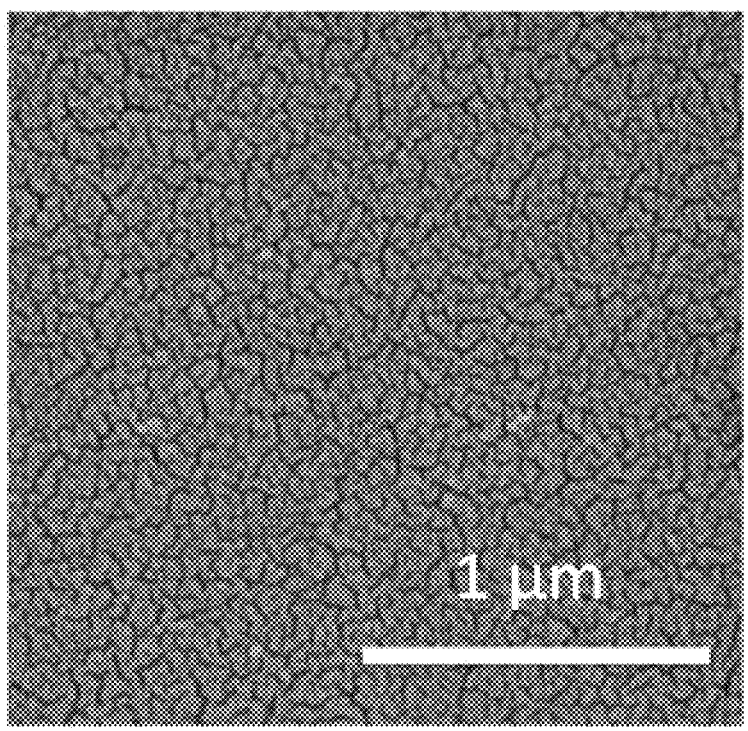

FIGS. 8c and 8d are SEM images showing the topography of $(BA)_2(MA)_3Pb_4I_{13}$ perovskite thin films cast at 30° C. and 110° C. The SEM images further confirm the much lower density of pinholes (seen as black spots) in the hot-cast films in comparison to RT cast films. The presence of pinholes makes it challenging to fabricate working planar-type devices.

Examples 8-11 and Comparative Examples 2-4: Device Fabrication and Characterization The 2D layered perovskite thin films from Examples 4 and 7 (hot-casting) and Comparative Example 1 (room temperature casting) were placed onto a spin coater chunk. A [6,6]-phenyl-C61-butyric acid methyl ester (PCBM) solution was prepared by dissolving 20 mg PCBM in 1 mL chlorobenzene. 50 µL of the PCBM solution was then dropped onto the perovskite coated FTO/PEDOT substrate and spin coated at 1,000 rpm for 60 seconds to form an electron transporting layer (ETL).

Metal electrodes (Al and Au) were deposited using a thermal evaporator with a shadow mask with a working area of 0.5 cm$^2$, thereby producing the solar cell devices of Examples 8 and 9 and Comparative Example 2.

In some embodiments, the 2D layered perovskite thin film devices were modified by the inclusion of a fullerene ($C_{60}$) electron transport layer, thereby producing, for example, the solar cell device of Example 10.

Comparative examples devices including 3D perovskite films were prepared in a similar manner as the Example devices including 2D layered perovskite films, except that the corresponding 3D perovskite (($MA)_3PbI_3$) was used. A solution of the 3D perovskite was deposited on substrates heated to 180° C. using a process similar to that described for the 2D perovskite thin films of Examples 1-7 in light of the hot-casting method described for 3D perovskites in Nie, W. et al., "High-efficiency solution-processed perovskite solar cells with millimeter-scale grains", *Science*, Jan. 30, 2015, 522-525.

The 3D perovskite thin films were then incorporated into solar cell devices, thereby producing, for example, the solar cell device of Comparative Example 3.

In some embodiments, the devices were subsequently encapsulated by depositing a layer of glass on the metal electrode and sealing the devices using an ultraviolet curable epoxy, thereby producing, for example, the solar cell devices of Example 11 and Comparative Example 4.

Example devices and comparative example devices were prepared as summarized in Table 1:

| Example | Thin film | Encapsulation |
|---|---|---|
| Example 8 | Example 4 $((BA)_2(MA)_3Pb_4I_{13}$, 110° C.) | — |
| Example 9 | Example 7 $((BA)_2(MA)_2Pb_3I_{10}$, 110° C.) | — |
| Example 10 | Example 4 $((BA)_2(MA)_3Pb_4I_{13}$, 110° C.) with $C_{60}$ layer | — |
| Example 11 | Example 4 $((BA)_2(MA)_3Pb_4I_{13}$, 110° C.) | glass/epoxy |
| Comparative Example 2 | Comparative Example 1 $((BA)_2(MA)_3Pb_4I_{13}$, 30° C.) | — |
| Comparative Example 3 | $((MA)_3PbI_3$, 180° C.) | — |
| Comparative Example 4 | $((MA)_3PbI_3$, 180° C.) | glass/epoxy |

The solar cell devices were characterized using a light source with a simulated AM1.5G (air mass 1.5 global 1-Sun)irradiance of 100 mW cm$^{-2}$. The light source was calibrated using a NIST-certified monocrystalline Si solar cell (Newport 532 ISO1599).

Figure 9A:
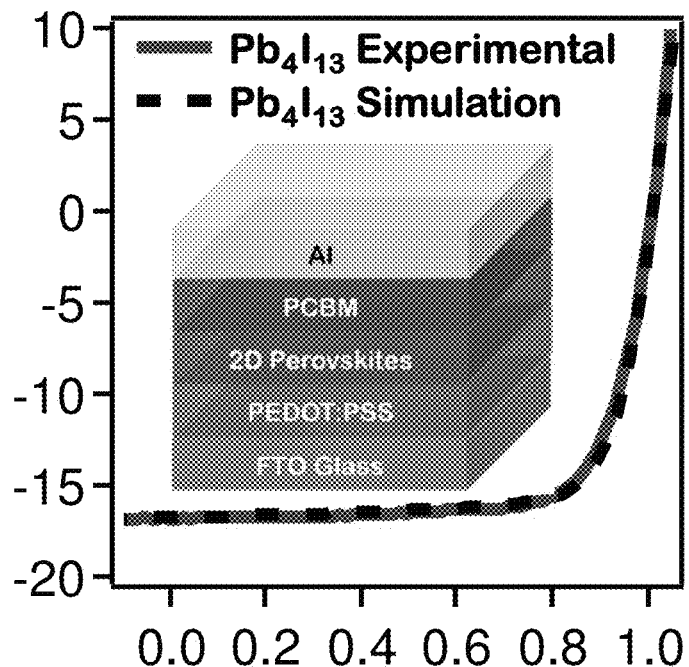
FIG. 9a is a graph of the experimental and simulated current density versus voltage (J-V curve) characteristics measured under standard AM1.5G illumination for the device prepared according to Example 8 (e.g., with a 230 nm thin film layer of $(BA)_2(MA)_3Pb_4I_{13}$ deposited using the hot-casting method). The solid red line shows the experimental data, while the dashed black line shows the simulated data. The inset is a schematic image showing the planar structure of the device. The device includes, from bottom to top, an FTO glass layer (grey), a poly(3,4-ethylenedioxythiophene):polystyrene sulfonate (PEDOT:PSS) layer (blue), a 2D perovskite layer (brown), a [6,6]-phenyl-C61-butyric acid methyl ester (PCBM) layer (red-brown), and an aluminum (Al) layer (silver).

FIG. 9a is a graph depicting the experimental (solid red line) and simulated (dashed black line) current density versus voltage (J-V curve) characteristics measured under standard AM1.5G illumination for the device with a 230 nm thin film layer of $(BA)_2(MA)_3Pb_4I_{13}$ deposited using the hot-casting method (Example 8). The inset is a schematic image showing the planar structure of the device, including, from bottom to top, an FTO glass layer (grey), a poly(3,4-ethylenedioxythiophene):polystyrene sulfonate (PEDOT:PSS) layer (blue), a 2D perovskite layer (brown), a [6,6]-phenyl-C61-butyric acid methyl ester (PCBM) layer (red-brown), and an aluminum (Al) layer (silver). The device exhibited a peak power conversion efficiency (PCE) of 12.51% with an open circuit voltage $V_{OC}$=1.01 V, short-circuit current density $J_{SC}$=16.76 mA cm$^{-2}$, and fill factor (FF) of 74.13%.

Figure 9B:
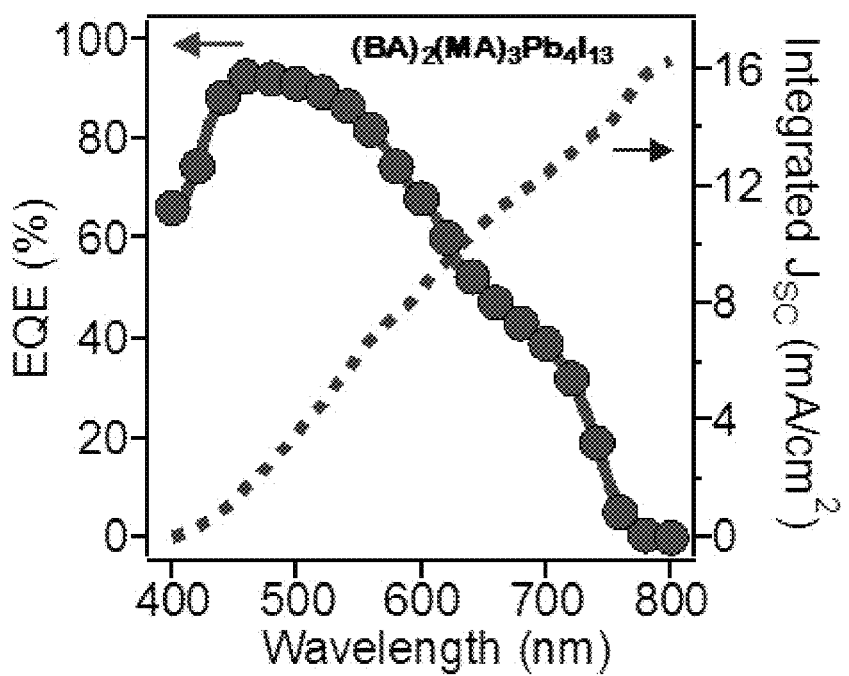
FIG. 9b is a graph of the measured external quantum efficiency (EQE) (red circles) and the integrated $J_{SC}$ (blue dashed line) for a $(BA)_2(MA)_3Pb_4I_{13}$ perovskite thin film device prepared according to Example 8.

FIG. 9b is a graph of the measured external quantum efficiency (EQE, red circles) and the integrated $J_{SC}$ (blue dashed line) for the $(BA)_2(MA)_3Pb_4I_{13}$ perovskite thin film device prepared according to Example 8. The EQE spectrum is in good agreement with the optical absorption profile (FIG. 5c) The integrated $J_{SC}$ from the EQE spectrum is calculated to be 16.31 mA cm$^{-2}$ for $(BA)_2(MA)_3Pb_4I_{13}$, which is within 3% of the $J_{SC}$ measured under AM1.5G standard irradiation.

Figure 10A:
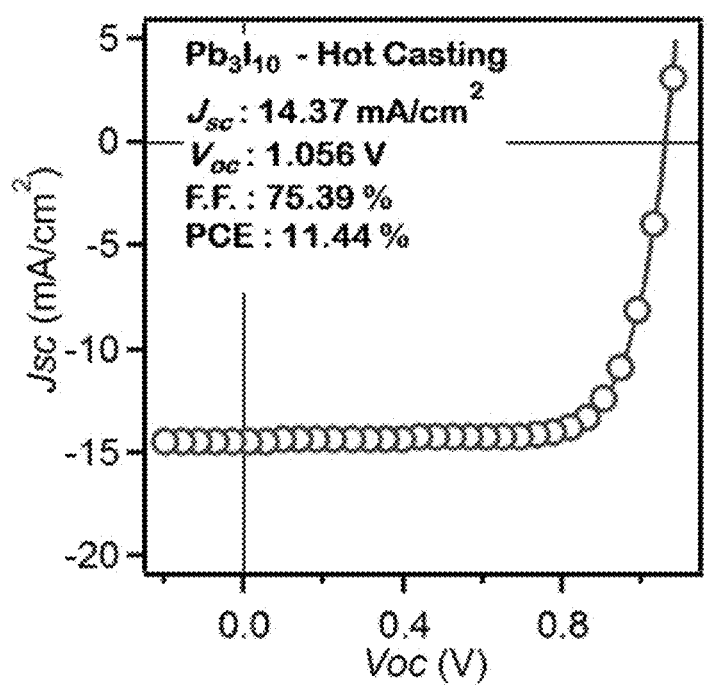
FIG. 10a is a graph depicting the current density versus voltage (J-V curve) characteristics (red circles) measured under standard AM1.5G illumination for the device prepared according to Example 9.

FIG. 10a is a graph depicting the current density versus voltage (J-V curve) characteristics (red circles) measured under standard AM1.5G illumination for the device with a 230 nm layer of $(BA)_2(MA)_2Pb_3I_{10}$ deposited using the hot-casting method (Example 9). The device exhibited a peak power conversion efficiency (PCE) of 11.44% with an open circuit voltage $V_{OC}$=1.056 V, short-circuit current density $J_{SC}$=14.37 mA cm$^{-2}$, and fill factor of 75.39%.

Figure 10B:
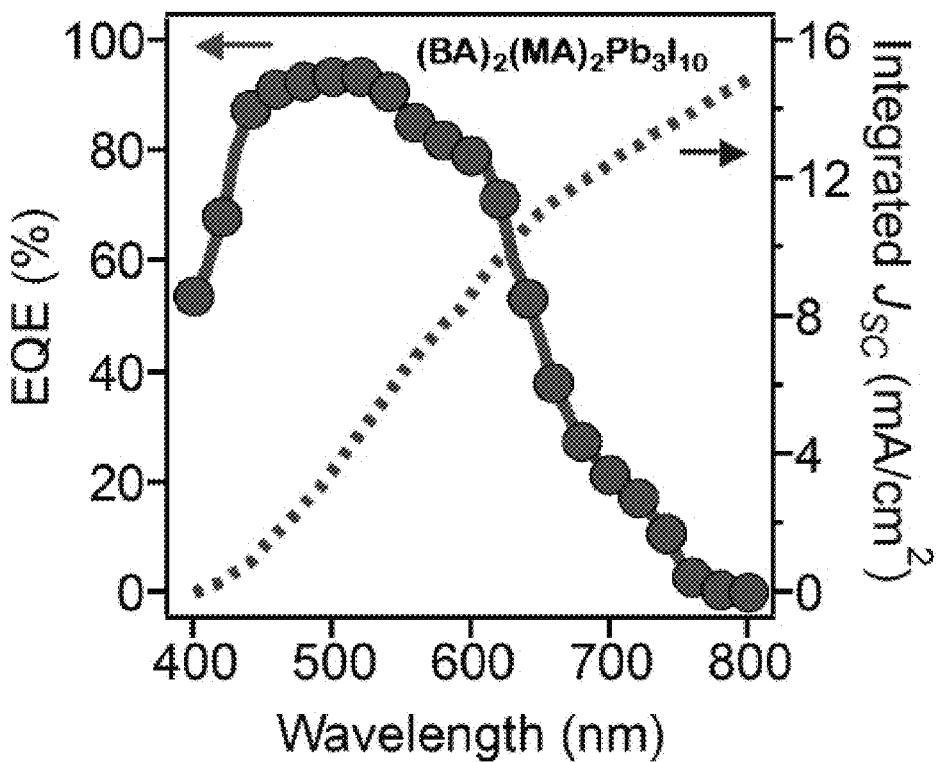
FIG. 10b is a graph of the measured external quantum efficiency (EQE, red circles) and the integrated current density ($J_{SC}$, blue dashed line) for a $(BA)_2(MA)_2Pb_3I_{10}$ perovskite thin film device prepared according to Example 9.

FIG. 10b is a graph of the measured external quantum efficiency (EQE, red circles) and the integrated current density ($J_{SC}$, blue dashed line) for $(BA)_2(MA)_2Pb_3I_{10}$ (Example 9). The integrated $J_{SC}$ from the EQE spectrum is calculated to be about 14 mA cm$^{-2}$ for $(BA)_2(MA)_2Pb_3I_{10}$.

In comparison, the 3D perovskite MAPbI$_3$ has a $V_{OC}$≈0.7-0.9 V. Accordingly, the layered 2D perovskites provide an opportunity to achieve a higher $V_{OC}$ than the 3D perovskites in a simple planar architecture.

Figure 11:
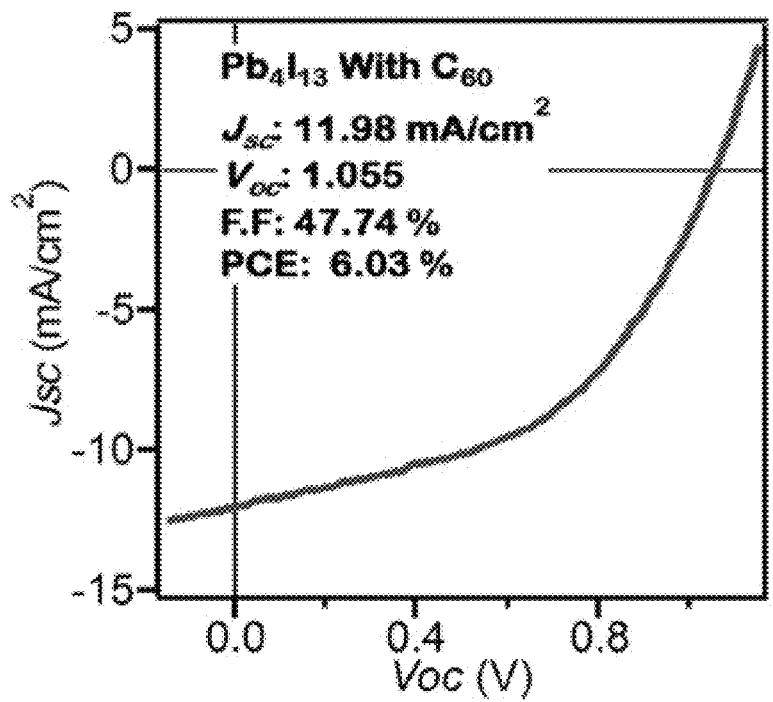
FIG. 11 is a graph depicting the experimental current density versus voltage (J-V curve, red line) characteristics measured under standard AM1.5G illumination for a $(BA)_2(MA)_3Pb_4I_{13}$ perovskite thin film device with a 230 nm layer of $Pb_4I_{13}$ (i.e., $(BA)_2(MA)_3Pb_4I_{13}$) deposited with $C_{60}$ as a contact modification candidate.

FIG. 11 is a graph depicting the experimental current density versus voltage (J-V curve) characteristics measured under standard AM1.5G illumination for a device with a 230 nm layer of $Pb_4I_{13}$ (($BA)_2(MA)_3Pb_4I_{13}$) deposited with fullerene ($C_{60}$) as a contact modifier (Example 10). The device exhibited a peak power conversion efficiency (PCE) of 6.03% with an open circuit voltage $V_{OC}$=1.055 V, short-circuit current density $J_{SC}$=11.98 mA cm−2, and fill factor of 47.74%.

Figure 12:
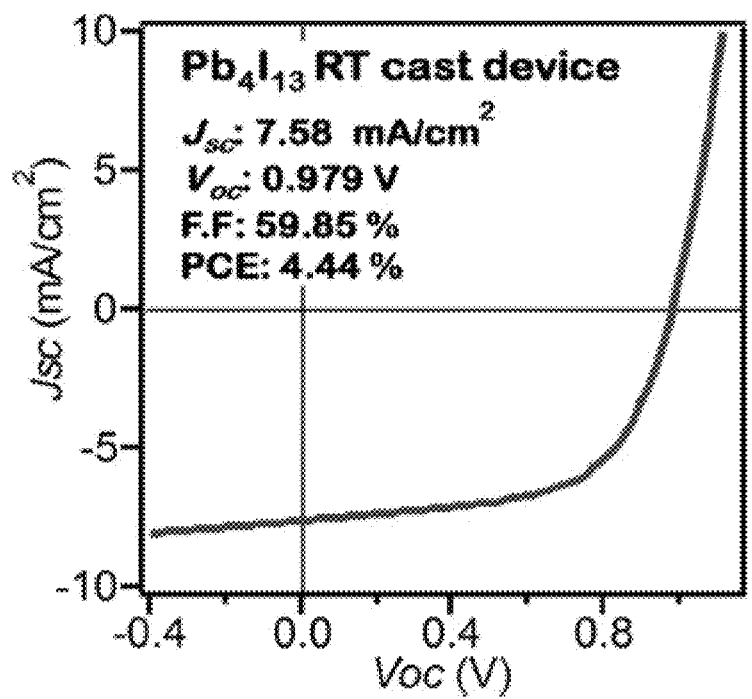
FIG. 12 is a graph depicting the experimental current density versus voltage (J-V curve, red line) characteristics measured under standard AM1.5G illumination for a $(BA)_2(MA)_3Pb_4I_{13}$ perovskite thin film device prepared according to Comparative Example 2.

FIG. 12 is a graph depicting the experimental current density versus voltage (J-V curve) characteristics measured under standard AM1.5G illumination for the device with a 230 nm thin film layer of $(BA)_2(MA)_3Pb_4I_{13}$ deposited using a conventional spin-coating method (e.g., spin-coating at room temperature/30° C.) (Comparative Example 2). The device exhibited a peak power conversion efficiency (PCE) of 4.44% with an open circuit voltage $V_{OC}$=0.979 V, short-circuit current density $J_{SC}$=7.58 mA cm$^{-2}$, and fill factor of 59.85%.

Charge mobility was measured using the charge extraction linear increasing voltage (CELIV) technique on the hot-cast and RT-cast device in the same device geometry. The device was connected to a function generator from the FTO side for negative increasing bias and the current transient was recorded by measuring the voltage drop through a resistor (50 ohms) connected in series with the device cathode side.

Figure 13:
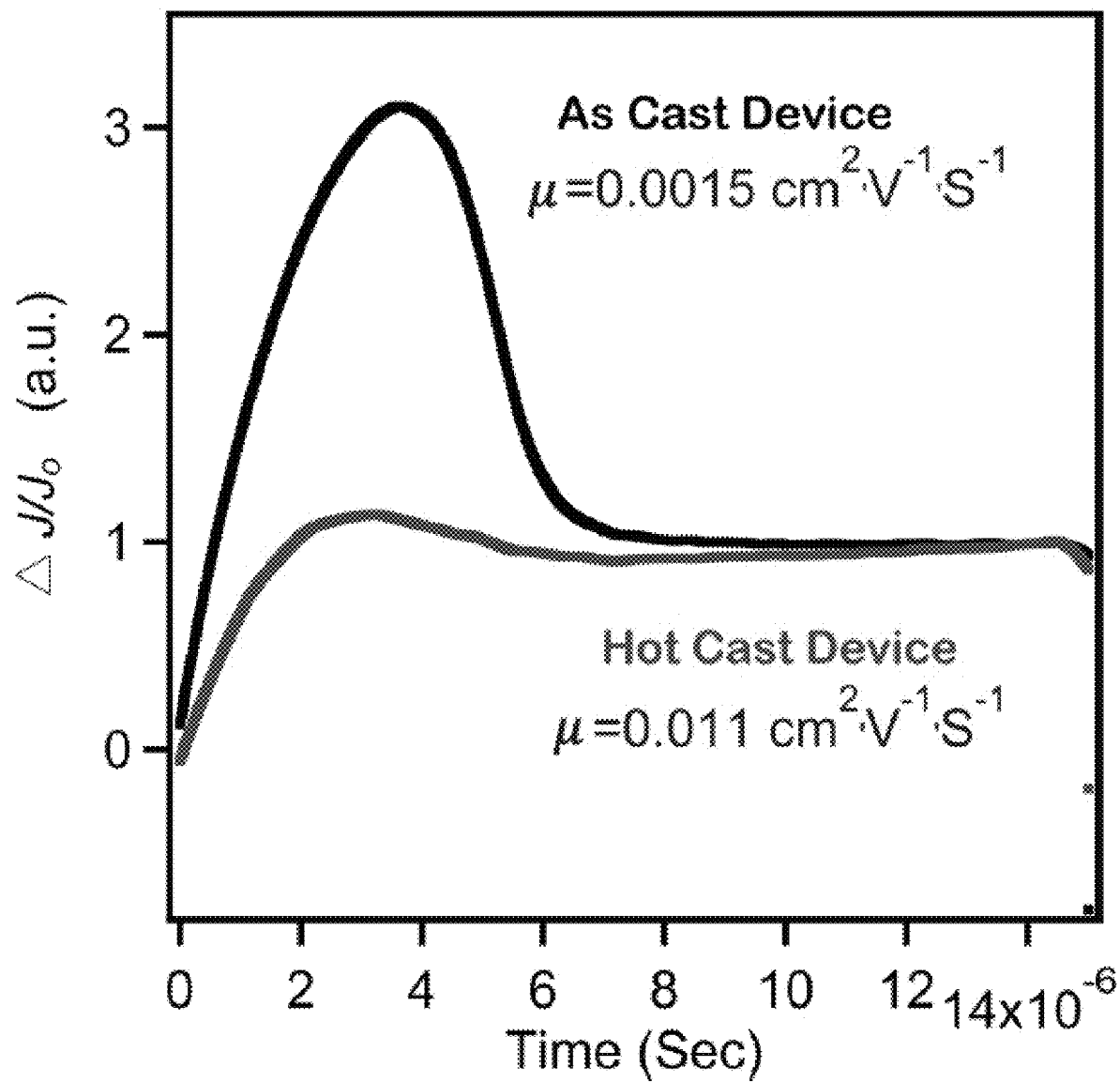
FIG. 13 is a graph depicting the dark current transient $(\Delta J/J_0)$, measured using the charge extraction linear increasing voltage (CELIV) technique, for the device prepared according to Comparative Example 2 ('As cast', black line) and a $(BA)_2(MA)_3Pb_4I_{13}$ perovskite thin film device prepared according to Example 8 ('Hot Cast', red line).

FIG. 13 is a graph depicting the dark current transient ($\Delta J/J_0$), measured using the CELIV technique, for $(BA)_2(MA)_3Pb_4I_{13}$ perovskite thin film devices cast at 110° C. (Example 8, 'Hot Cast' red line) and room-temperature (Comparative Example 2, 'As cast', black line). The mobility values (µ) were calculated to be 0.011 $cm^2V^{-1}s^{-1}$ and 0.015 $cm^2V^{-1}s^{-1}$, respectively.

The large increase in efficiency for the hot-cast 2D perovskite films is therefore attributed to the increases in $J_{SC}$ and fill factor. This increase may be caused by enhanced charge transport and mobility facilitated by the near-perfect vertical (out-of-plane) alignment of the $\{(MA)_{n-1}Pb_nI_{3n+1}\}^{2-}$ slabs relative to the FTO substrate, as depicted in FIG. 7.

The good crystallinity and thin film uniformity that are realized by the hot-casting technique lead to continuous charge-transport channels that enable the highly mobile photo-generated carriers to travel through the 2D $\{(MA)_{n-1}Pb_nI_{3n+1}\}^{2-}$ slabs across device electrodes, without being blocked by the insulating spacer layers.

Figure 14:
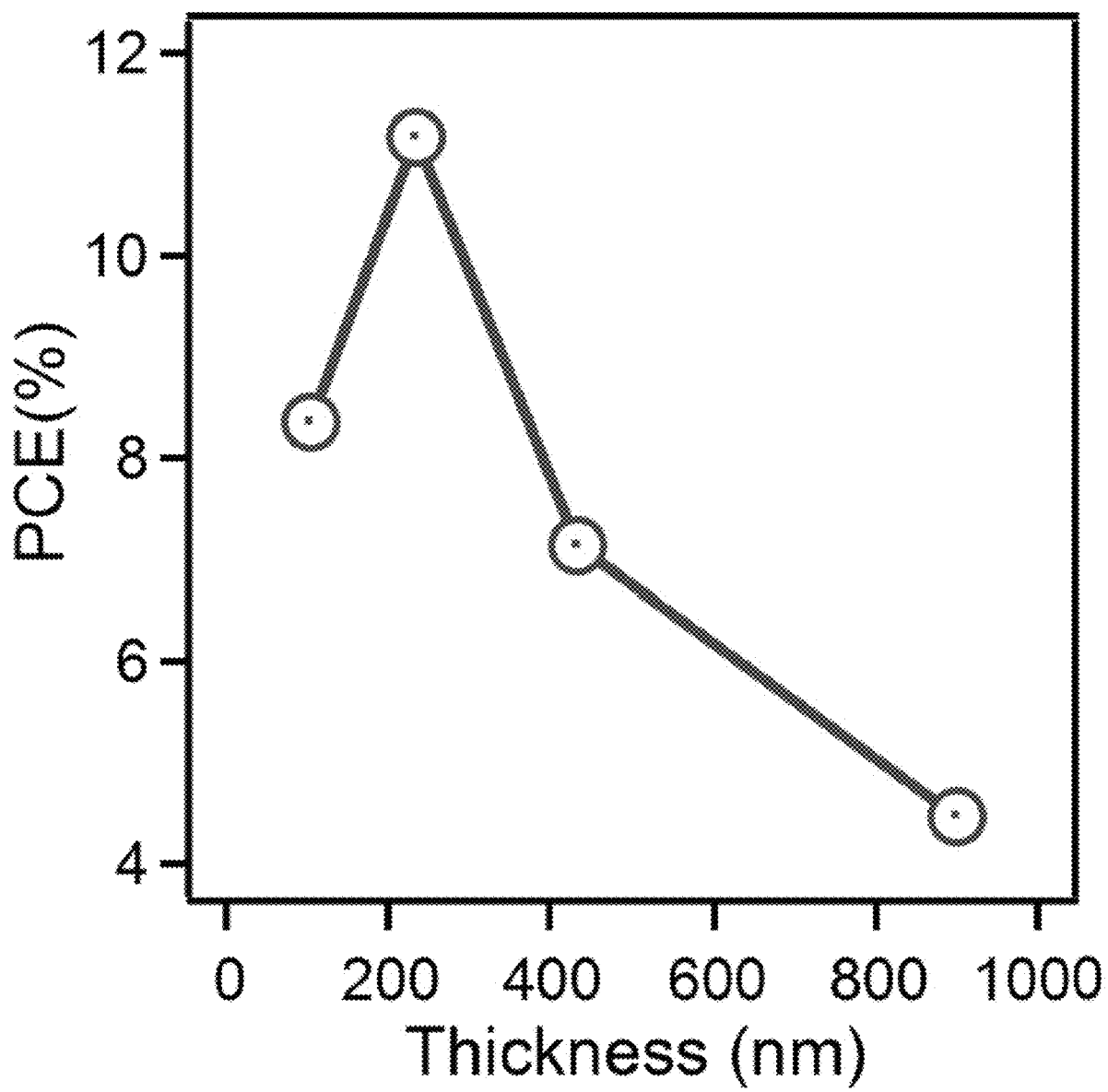
FIG. 14 is a graph showing the power conversion efficiency (PCE, %, red circles) as a function of thin film thickness in a $(BA)_2(MA)_3Pb_4I_{13}$ perovskite thin film device prepared according to Example 8.

The thickness of a $(BA)_2(MA)_3Pb_4I_{13}$ perovskite thin film was optimized for use in a solar cell by varying the molar concentration of the perovskite solution (0.9 M to 0.115 M based on total $Pb^{2+}$) used for hot-casting. FIG. 14 is a graph showing the PCE (red circles) as a function of thin film thickness for the $(BA)_2(MA)_3Pb_4I_{13}$ perovskite thin film. The $J_{SC}$ was found to be optimal at a film thickness of approximately 230 nm.

Figure 15A:
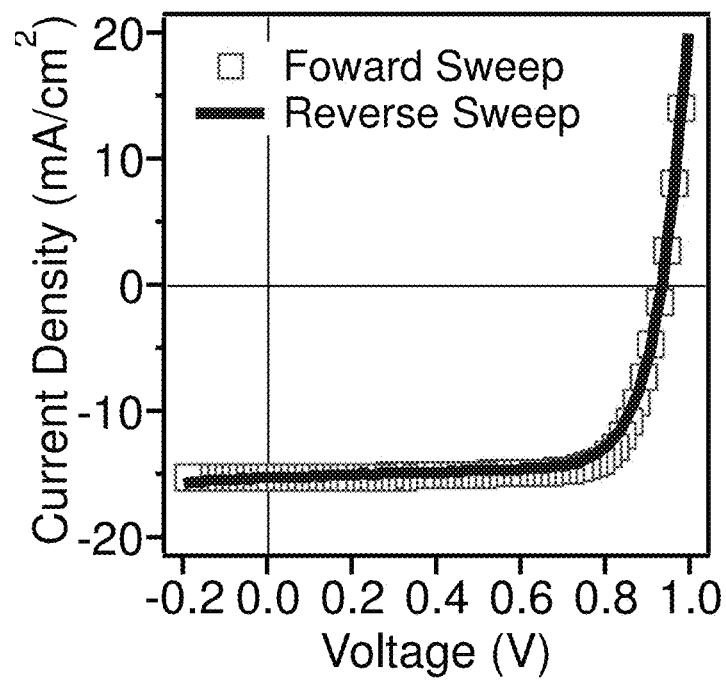
FIG. 15a is a graph of the current density as a function of applied voltage, using forward (increasing, red squares) and backward (decreasing, blue line) sweep directions for the $(BA)_2(MA)_3Pb_4I_{13}$ perovskite thin film device prepared according to Example 8.
Figure 15B:
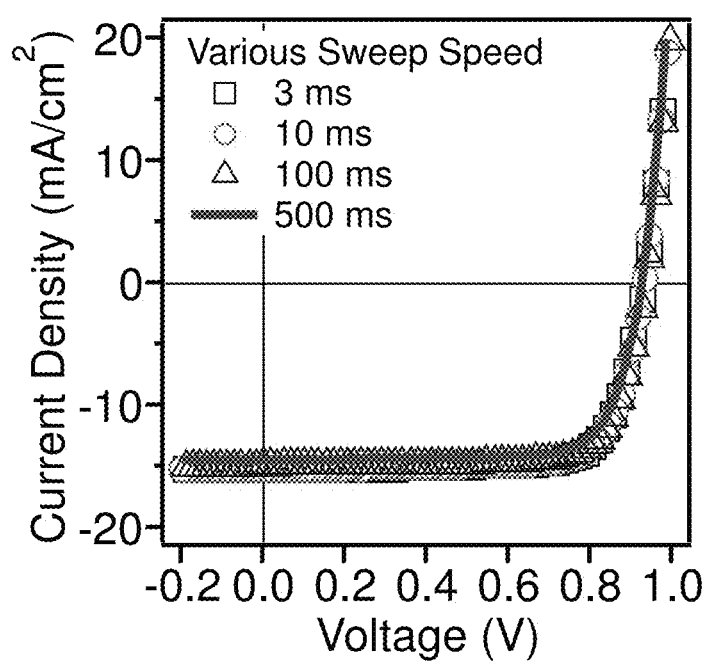
FIG. 15b is a graph of the current density as a function of applied voltage, using different voltage delay times (3 ms, black squares; 10 ms, green circles; 100 ms, blue triangles; and 500 ms, red line) for the $(BA)_2(MA)_3Pb_4I_{13}$ perovskite thin film device prepared according to Example 8.

The $(BA)_2(MA)_3Pb_4I_{13}$ perovskite thin film devices were tested for detrimental hysteresis effects that have been reported in conventional 3D hybrid perovskites. FIG. 15a is a graph of the current density as a function of applied voltage, using forward (increasing, red squares) and backward (decreasing, blue line) sweep directions for the $(BA)_2(MA)_3Pb_4I_{13}$ perovskite thin film device prepared according to Example 8. FIG. 15b is a graph of the current density as a function of applied voltage, using different voltage delay times (3 ms, black squares; 10 ms, green circles; 100 ms, blue triangles; and 500 ms, red line) for the $(BA)_2(MA)_3Pb_4I_{13}$ perovskite thin film device prepared according to Example 8. In contrast to previous reports, no hysteresis (e.g., a change in the observed current upon subsequent scans) was observed in either case.

Figure 16:
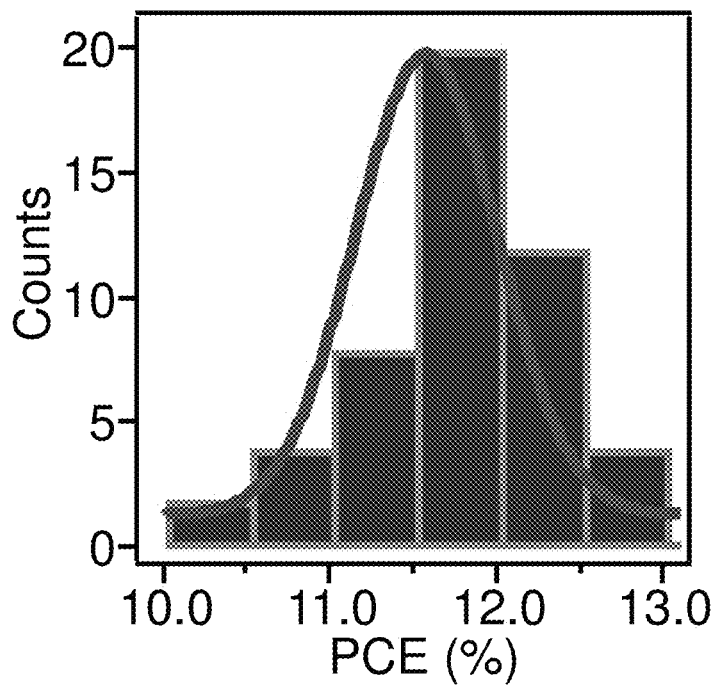
FIG. 16 is a statistical distribution chart of the experimental PCE of over 50 $(BA)_2(MA)_3Pb_4I_{13}$ perovskite thin film devices prepared according to Example 8. The blue bars indicate the number of devices exhibiting a PCE within a particular range, while the red line indicates a fit of the experimental data.

FIG. 16 is a statistical distribution chart of the experimental PCE of over 50 $(BA)_2(MA)_3Pb_4I_{13}$ perovskite thin film solar cell devices. The blue bars indicate the number of devices exhibiting a PCE within a particular range, while the red line indicates a fit of the experimental data. The devices demonstrated good reproducibility with an average efficiency of 11.60%±0.92%.

Figure 17:
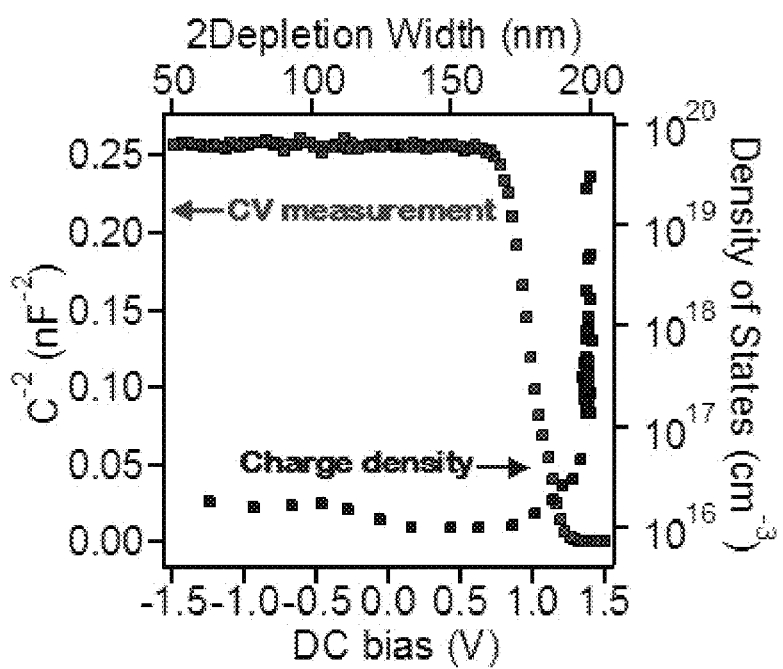
FIG. 17 is a plot of the charge density profile calculated according to the Mott-Schottky equation in the reverse bias regime (blue squares, top and right axis) and the capacitance-voltage (C-V) measurements (red squares, bottom and left axes) for a $(BA)_2(MA)_3Pb_4I_{13}$ perovskite thin film device prepared according to Example 8.

Capacitance-voltage (C-V) measurements were performed on the $(BA)_2(MA)_3Pb_4I_{13}$ perovskite thin film devices of Example 8 to rationalize the reproducibility and the lack of hysteresis of these devices. FIG. 17 is a plot of the charge density profile calculated according to the Mott-Schottky equation in the reverse bias regime (blue squares, top and right axis) and the capacitance-voltage (C-V) measurements (red squares, bottom and left axes). The C-V curve shows that the device is fully depleted, and the trap density is quite small to substantially affect the J-V characteristics through trapped charges. The device behaves like a p-i-n junction, where the layered perovskite acts as an intrinsic semiconductor. The total charge density in the depletion region was calculated to be 1016 $cm^{-3}$.

The calculated edge of the depletion region, where the charge density becomes flat (about 200 nm), is comparable to the film thickness, which indicates that the built-in field is strong enough to extract the charges effectively, leading to a very efficient device.

Figure 18:
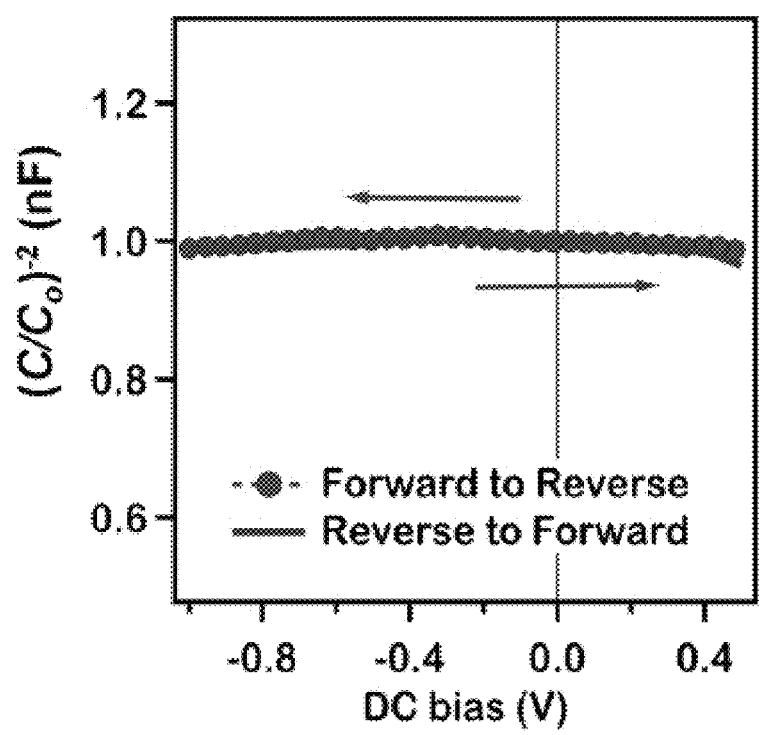
FIG. 18 is a plot of $(C/C_0)^{-2}$ as a function of DC bias for a $(BA)_2(MA)_3Pb_4I_{13}$ perovskite thin film device prepared according to Example 8. The red circles follow the capacitance response with respect to DC voltage on the forward to reverse sweep (toward more negative voltages), while the blue line follows the response on the reverse to forward sweep (toward more positive voltages).

FIG. 18 is a plot of $(C/C_0)^{-2}$ as a function of DC bias for the $(BA)_2(MA)_3Pb_4I_{13}$ perovskite thin film device of Example 8, where $C_0$ is the capacitance of a geometric capacitor. The red circles follow the capacitance response with respect to DC voltage on the forward to reverse sweep (toward more negative voltages), while the blue line follows the response on the reverse to forward sweep (toward more positive voltages).With a fully depleted junction, the C-V curve for the device is not affected by the direction of the voltage scan owing to the lack of trap states, consistent with the observation of hysteresis-free J-V curves.

Figure 19A:
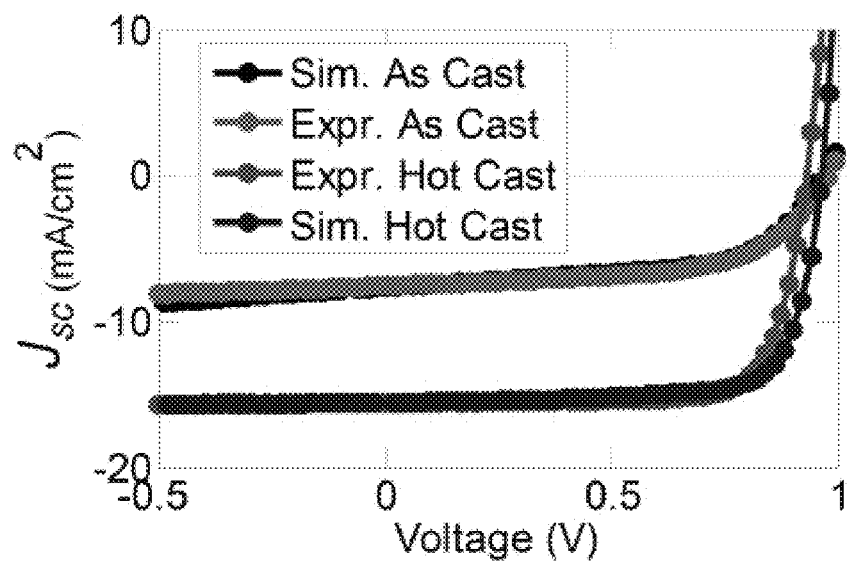
FIG. 19a is a graph showing the experimental ('Expr.') and simulated ('Sim.') J-V curve characteristics for the $(BA)_2(MA)_3Pb_4I_{13}$ perovskite thin film device prepared according to Comparative Example 2 ('As cast', green and black circles, respectively) and the $(BA)_2(MA)_3Pb_4I_{13}$ perovskite thin film device prepared according to Example 8 ('Hot Cast', red and blue circles, respectively).

A self-consistent optoelectronic simulation (involving the solution of Maxwell, Poisson and drift-diffusion equations) of $(BA)_2(MA)_3Pb_4I_{13}$ perovskite thin films cast at 30° C. and 110° C. was performed to examine the hypothesis of improved material quality when using the hot-cast method. The defect density and mobility were used as the fitting parameters. The fitted defect density is in the range of the measured charge density (see FIG. 17). FIG. 19a is a graph showing the Experimental ('Expr.') and Simulated ('Sim) J-V characteristics of $(BA)_2(MA)_3Pb_4I_{13}$ perovskite thin film devices prepared according to Comparative Example 2 ('As cast', green and black circles, respectively) and Example 8 ('Hot Cast', red and blue circles, respectively). The hot-cast thin film device shows a current density with a larger magnitude and higher fill factor. The simulation results are in good agreement with experimental data, and they reproduce the general features of the J-V characteristic of both the hot-cast (12.52% efficiency) and room-temperature-cast (4.44% efficiency) solar cells. The increase in efficiency can be attributed to mobility improvement, reduced defect density, and improved (i.e., decreased) series resistance.

Figure 19B:
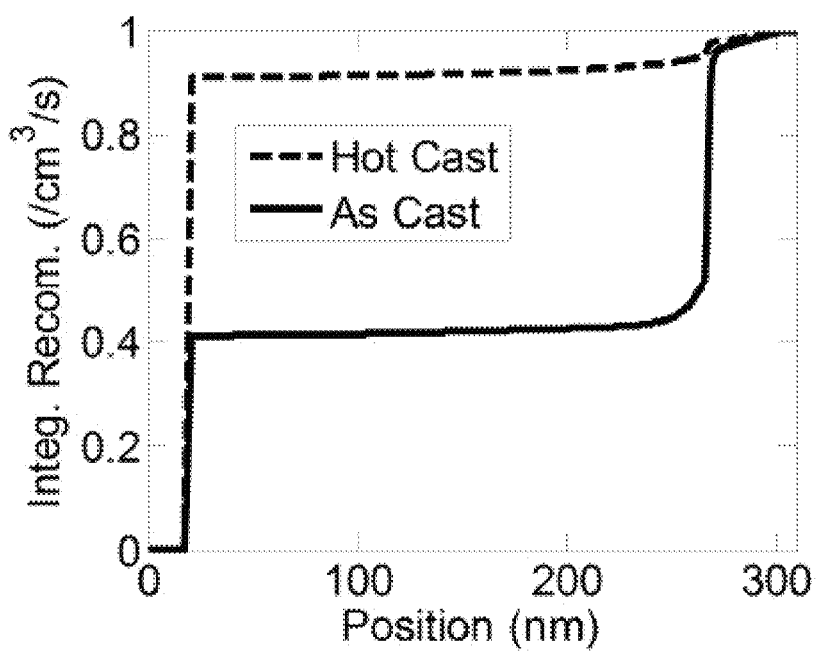
FIG. 19b is a plot of the integrated recombination inside three layers of a solar cell vs. distance in the thin film from the substrate for a $(BA)_2(MA)_3Pb_4I_{13}$ device prepared according to Comparative Example 2 ('As cast', solid black line) and a $(BA)_2(MA)_3Pb_4I_{13}$ device prepared according to Example 8 ('Hot Cast', dashed black line).

FIG. 19b is a plot of the integrated recombination inside three layers of a solar cell vs. the distance in the thin film from the substrate for a $(BA)_2(MA)_3Pb_4I_{13}$ device prepared according to Comparative Example 2 ('As cast', solid black line) and a $(BA)_2(MA)_3Pb_4I_{13}$ device prepared according to Example 8 ('Hot Cast', dashed black line). Peak recombination shifts toward the PCBM/perovskite interface because the barrier for generated carriers is less in the hot-cast case than in the room-temperature-cast case.

Figure 19C:
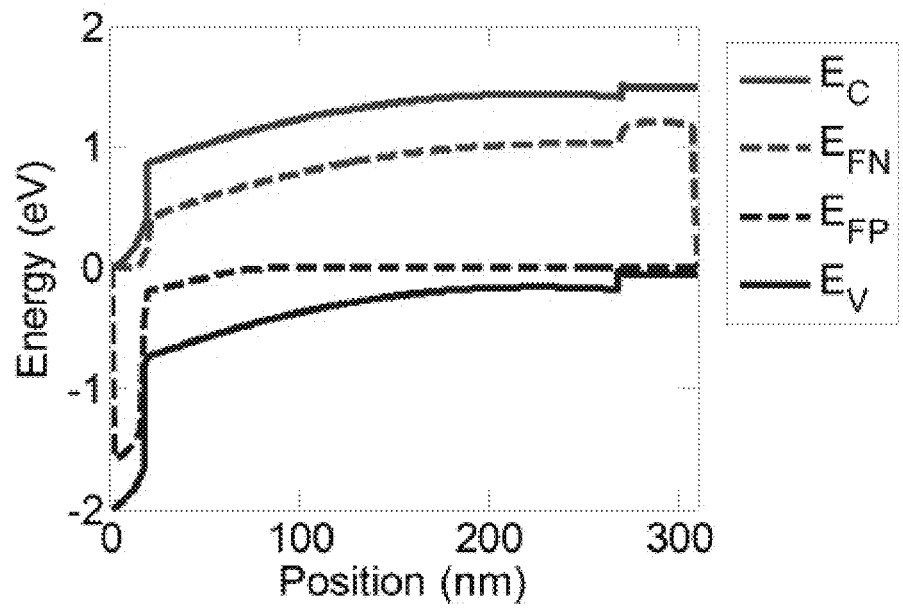
FIG. 19c is an energy band diagram for a $(BA)_2(MA)_3Pb_4I_{13}$ device prepared according to Example 8 ('Hot Cast'). The calculated energy bands include the conduction band ($E_C$, solid red line), valence band ($E_v$, solid blue line), electron quasi-Fermi level ($E_{FN}$, dashed red line), and hole quasi-Fermi level ($E_{FP}$, dashed blue line).
Figure 19D:
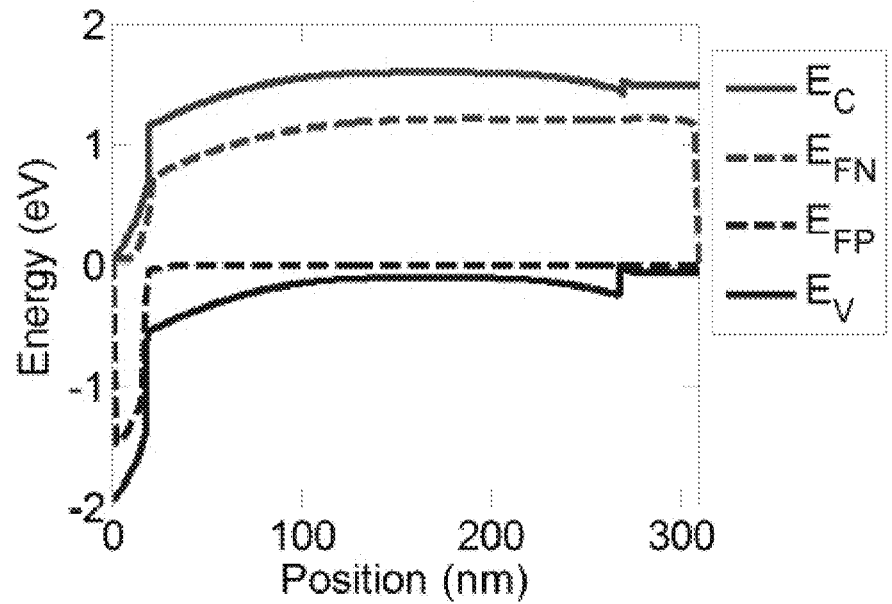
FIG. 19d is an energy band diagram for a $(BA)_2(MA)_3Pb_4I_{13}$ device prepared according to Comparative Example 2 ('As cast'). The calculated energy bands include the conduction band ($E_C$, solid red line), valence band ($E_v$, solid blue line), electron quasi-Fermi level ($E_{FN}$, dashed red line), and hole quasi-Fermi level ($E_{FP}$, dashed blue line).

FIG. 19c is an energy band diagram for a $(BA)_2(MA)_3Pb_4I_{13}$ device prepared according to Example 8 ('Hot Cast'). Generated carriers face a lower barrier in the hot-cast case, especially close to the PEDOT/perovskite interface. As used herein, "$E_C$" refers to the conduction band (solid red line); "$E_v$" refers to the valence band (solid blue line); "$E_{FN}$" refers to the electron quasi-Fermi level (dashed red line); and "$E_{FP}$" refers to the hole quasi-Fermi level (dashed blue line).

Figure 20A:
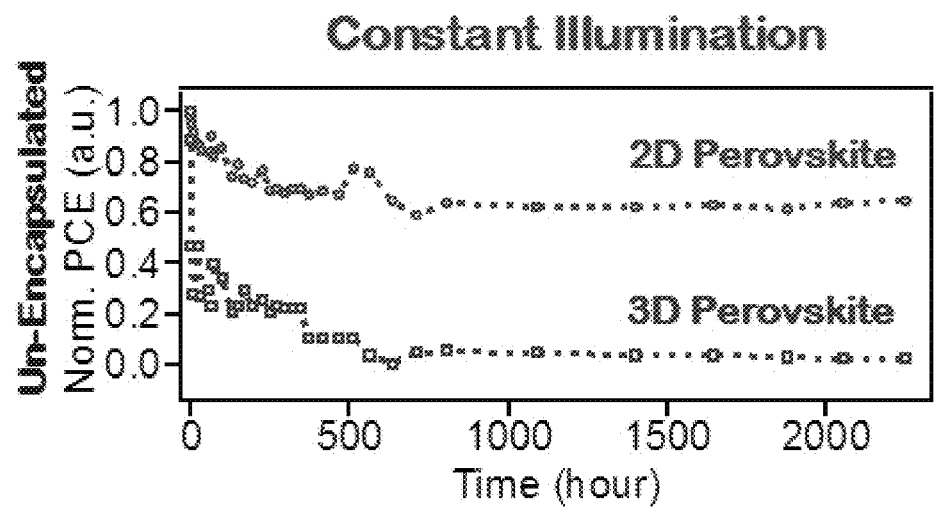
FIG. 20a shows the normalized power conversion efficiency as a function of testing time under constant AM1.5G illumination for the unencapsulated devices prepared according to Example 8 ('2D perovskite', red line) and the device prepared according to Comparative Example 3 ('3D perovskite', blue line).

Aggressive long-term stability measurements were performed on the layered 2D and 3D perovskite devices and thin films. First, the stability of devices without any encapsulation layer under light stress were compared. FIG. 20a shows the normalized power conversion efficiency as a function of device testing time under constant AM1.5G illumination. The PCE of the $(MA)PbI_3$ 3D perovskite device (Comparative Example 3, blue line) degraded to 40% of its original value within the first 24 hours, followed by slow degradation to <10% of its original value over the next 2,250 hours (about 94 days). This result is consistent with reports of the same device structure and testing conditions. In contrast, the 2D perovskite device (red line) retained 80% of its original PCE after 200 hours and slowly degraded to about 70% of its original value after another 2,050 hours.

Figure 20B:
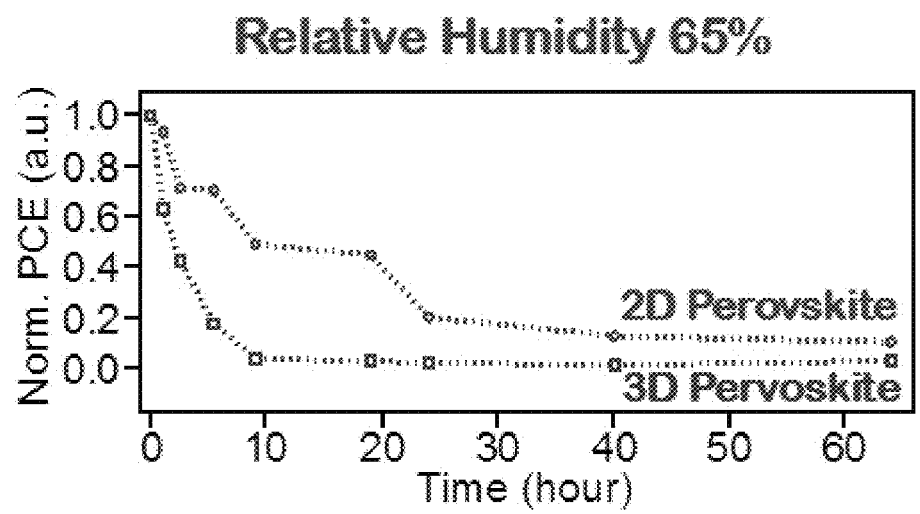
FIG. 20b shows the normalized PCE as a function of testing time under 65% relative humidity for the unencapsulated devices prepared according to Example 8 ('2D perovskite', red line) and the device prepared according to Comparative Example 3 ('3D perovskite', blue line).

Second, unencapsulated solar cells were placed in a humidity chamber (with a relative humidity of 65%) to compare their performances in response to humidity stress. FIG. 20b shows the normalized PCE as a function of testing time, under 65% relative humidity, for the $(BA)_2(MA)_3Pb_4I_{13}$ layered 2D perovskite devices (Example 8, red line) and the $(MA)PbI_3$ 3D perovskite device (Comparative Example 3, blue line). The 3D perovskite devices underwent a marked degradation within the first 10 hours of exposure. This degradation is expected, owing to the hygroscopic nature of the MA cation and the PEDOT layer. The unencapsulated 2D perovskite devices also show degradation, but at a much slower rate in comparison to the 3D perovskite devices. Without being bound by any particular theory, it is believed that the slower degradation could be due to the long and bulkier hydrophobic organic side group in the 2D perovskite structure that, to a large degree, can prevent (or delay) the direct exposure to moisture and thus increase its threshold against degradation.

Figure 20C:
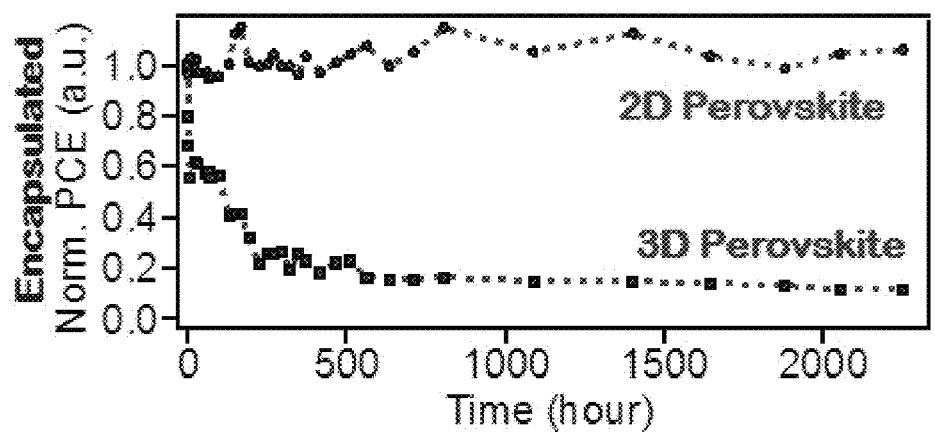
FIG. 20c shows the normalized PCE for the glass-encapsulated devices prepared according to Example 10 ('2D perovskite', red circles) and Comparative Example 4 ('3D perovskite', blue squares) tested under constant AM1.5G illumination for over 2,250 h.
Figure 20D:
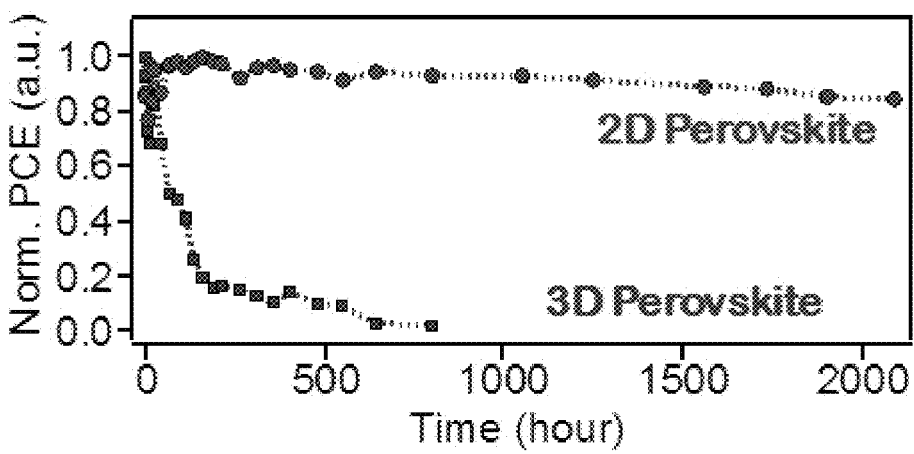
FIG. 20d shows the normalized PCE for the glass-encapsulated devices prepared according to Example 10 ('2D perovskite', red circles) and Comparative Example 4 ('3D perovskite', blue squares) tested under 65% humidity for over 2,250 h.

Finally, the same set of stability tests (under light or humidity) were performed on the 2D and 3D devices with simple glass encapsulation, according to Example 11 and Comparative Example 4, respectively. FIG. 20c shows the normalized PCE for encapsulated 2D (red line) and 3D (blue line) perovskite devices tested under constant AM1.5G illumination for over 2,250 hours. FIG. 20d show the normalized PCE for encapsulated 2D (red line) and 3D (blue line) perovskite devices tested under 65% humidity for over 2,250 h.

Under light stress (AM1.5G illumination), the PCE in the 3D device (Comparative Example 4) degraded to about 50% of its original value within the first 10 hours (similar to the unencapsulated 3D device as shown in FIG. 20a), progressively degraded at a very slow rate over the next 800 hours, and then saturated at approximately 10% of its original value. In contrast, the 2D encapsulated perovskite device (Example 11) were found to be extremely robust, with no degradation and negligible hysteresis over 2,250 hours of constant light stress (FIG. 20c). From the light stress tests for the 3D perovskites, it was concluded that the observed degradation in the first 10 hours in the encapsulated and unencapsulated devices is similar, and so is independent of encapsulation, suggesting that the degradation is a light-activated process.

Figure 21A:
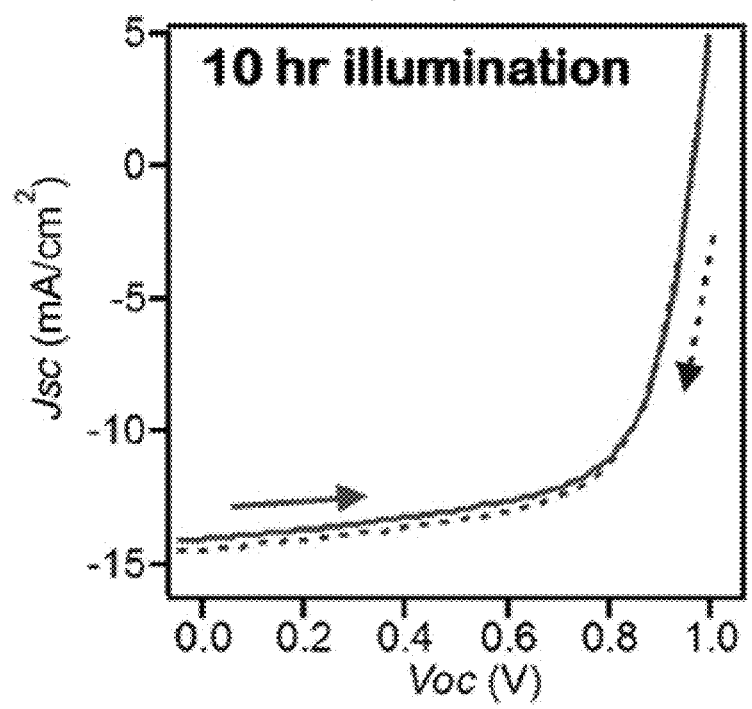
FIGS. 21a to 21c are J-V curve plots of current density $J_{SC}$ versus open circuit voltage $V_{OC}$ for the devices prepared according to Example 8 after 10 hours (b), 1,000 hours (c) and 2,250 hours (d) of constant illumination. The red line corresponds to the forward sweep (toward more positive voltages), while the blue line corresponds to the reverse sweep (toward less positive voltages).
Figure 21B:
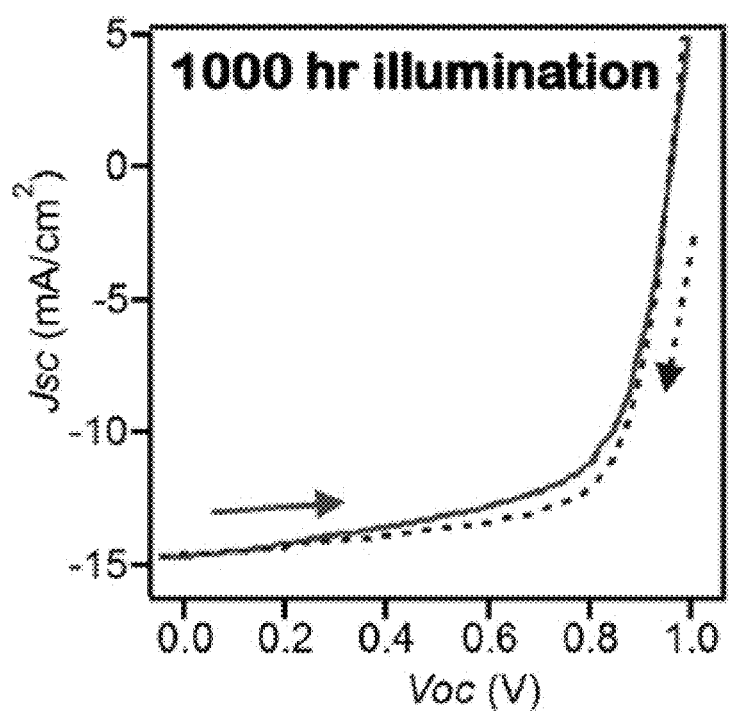
Figure 21C:
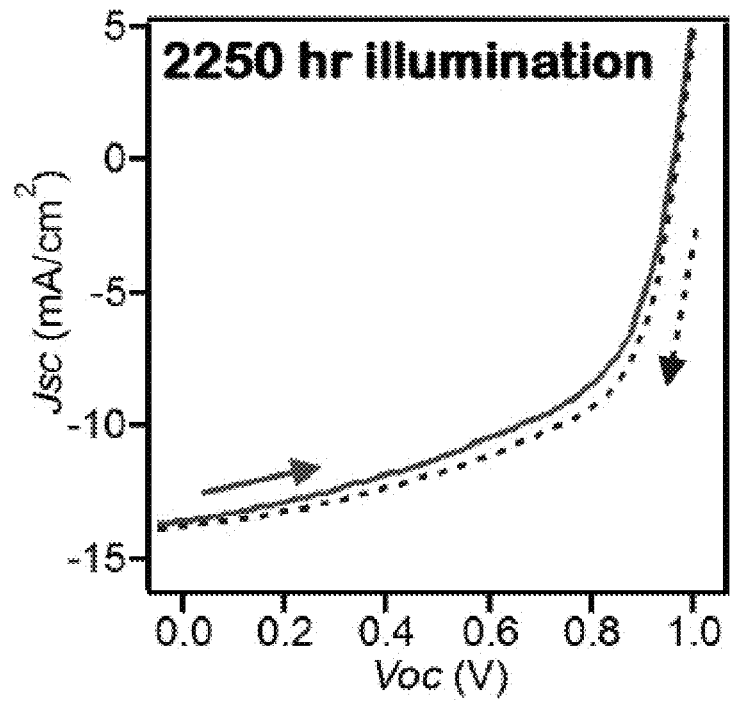

FIGS. 21a to 21c are J-V plots of current density ($J_{SC}$) versus open circuit voltage ($V_{OC}$) for $(BA)_2(MA)_3Pb_4I_{13}$ devices after 10 hours (b), 1,000 hours (c) and 2,250 hours (d) of constant illumination. The red line corresponds to the forward sweep (toward more positive voltages), while the blue line corresponds to the reverse sweep (toward less positive voltages).

The humidity stress test for the encapsulated devices (FIG. 20d) reveals that the degradation rate of the PCE for 3D perovskites is much slower than for unencapsulated devices (FIG. 20b), but that the PCE still decreases to <10% of its original value over 350 h. By contrast, the encapsulated 2D devices do not exhibit any degradation in the first 650 hours, representing a substantial slowing down of the degradation in humidity.

Figure 22A:
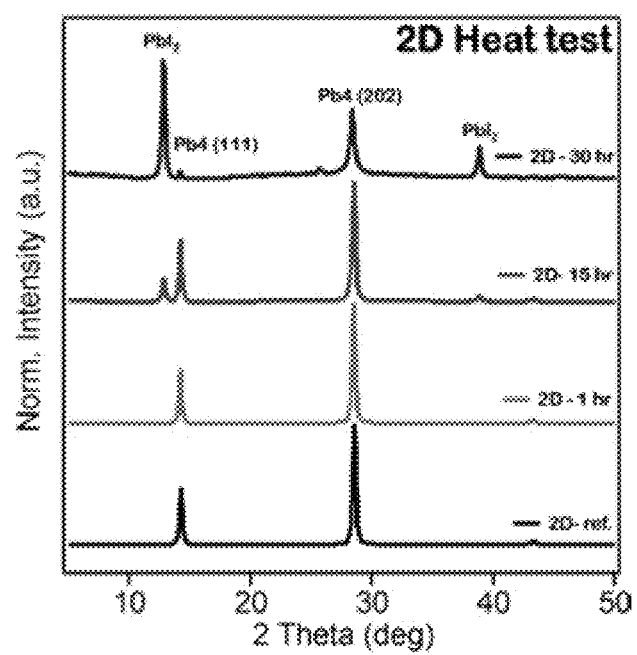
FIG. 22a is an XRD spectra of a $(BA)_2(MA)_3Pb_4I_{13}$ (2D perovskite) thin film after being held at 80° C. in darkness for 0 hours (black line), 1 hour (green line), 15 hours (red line), and 30 hours (blue line).
Figure 22B:
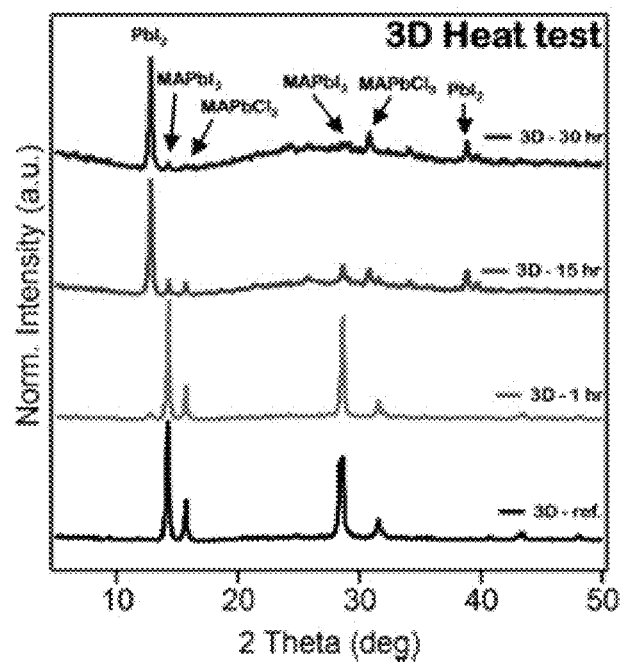
FIG. 22b is an XRD spectra of a $(MA)_3PbI_3$ (3D perovskite) thin film after being held at 80° C. in darkness for 0 hours (black line), 1 hour (green line), 15 hours (red line), and 30 hours (blue line).

FIGS. 22a and 22b are X-ray Diffraction (XRD) spectra of 2D and 3D perovskite thin films, respectively, held at 80° C. in darkness for 0 hours (black line), 1 hour (green line), 15 hours (red line), and 30 hours (blue line) (spectra are offset for clarity; 'ref.' refers to freshly made thin film, measured after 0 hours of heat stress).

Figure 22C:
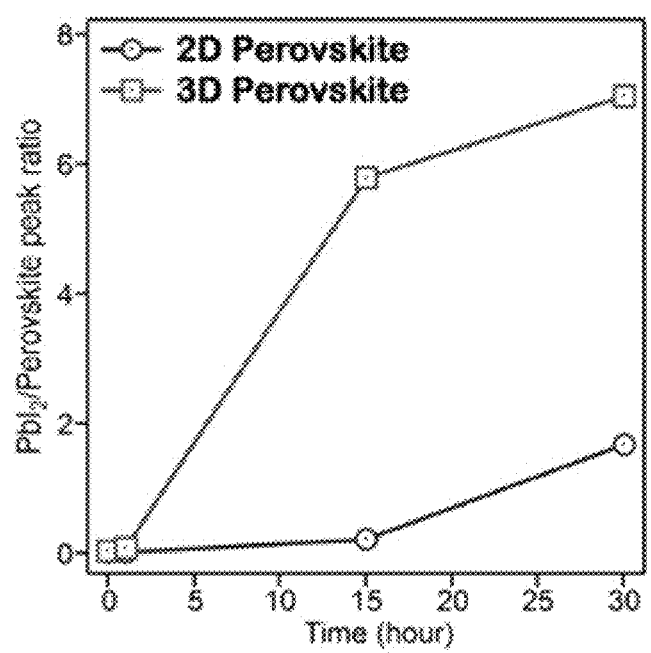
FIG. 22c is a graph of the peak intensity ratio for the $PbI_2$ (2θ=12.7°) and perovskite (2θ=14.2°) main peaks in the GIXRD spectra of $(BA)_2(MA)_3Pb_4I_{13}$ 2D perovskite materials (blue circles) and $(MA)_3PbI_3$ 3D perovskite materials (red squares) over 30 hours of heating at 80° C.

FIG. 22c is a graph of the ratio of the $PbI_2$ ($2\theta=12.7°$) and perovskite ($2\theta=$) 14.2° main peaks in the spectra in a and b for the 2D perovskite (blue line) and 3D perovskite (red line) materials over 0-30 hours of heating at 80° C.

These stress tests demonstrate that the 2D layered perovskite devices are stable over long-term operation against light soaking and humidity, in contrast to 3D perovskite devices. These results reinforce the benefits of encapsulation schemes, as well as the use of design strategies, such as the addition of metal oxide layers onto 3D perovskites to improve charge transport, and the encapsulation of layered 2D perovskite devices for long-term stability.

As discussed above, the materials and process parameters according to embodiments of the present invention may be adjusted to yield thin films of different perovskites with suitable properties for one or more optoelectronic devices. For example, the thin films described herein may be applied in light emitting devices, photovoltaics, solar cells, LASERs, electrically injected LASERs, photo or charge particle detectors, or field effect transistors.

While certain exemplary embodiments of the present disclosure have been illustrated and described, those of ordinary skill in the art will recognize that various changes and modifications can be made to the described embodiments without departing from the spirit and scope of the present invention, and equivalents thereof, as defined in the claims that follow this description. For example, although certain components may have been described in the singular, i.e., "a" cation, "an" anion, and the like, one or more of these components in any combination can be used according to the present disclosure.

Also, although certain embodiments have been described as "comprising" or "including" the specified components, embodiments "consisting essentially of" or "consisting of" the listed components are also within the scope of this disclosure. For example, while embodiments of the present invention are described as comprising dissolving the layered 2D perovskite material in a solvent; heating the perovskite solution; preheating a substrate; transferring the heated substrate; depositing a first volume of the perovskite solution onto the heated substrate; and spin-coating the first volume of the perovskite solution onto the heated substrate, embodiments consisting essentially of or consisting of these actions are also within the scope of this disclosure. Accordingly, a method of generating an electron beam may consist essentially of dissolving the layered 2D perovskite material in a solvent; heating the perovskite solution; preheating a substrate; transferring the heated substrate; depositing a first volume of the perovskite solution onto the heated substrate; and spin-coating the first volume of the perovskite solution onto the heated substrate. In this context, "consisting essentially of" means that any additional components or process actions will not materially affect the outcome produced by the method.

As used herein, unless otherwise expressly specified, all numbers such as those expressing values, ranges, amounts or percentages may be read as if prefaced by the word "about," even if the term does not expressly appear. Further, the word "about" is used as a term of approximation, and not as a term of degree, and reflects the penumbra of variation associated with measurement, significant figures, and interchangeability, all as understood by a person having ordinary skill in the art to which this disclosure pertains. Any numerical range recited herein is intended to include all sub-ranges subsumed therein. Plural encompasses singular and vice versa. For example, while the present disclosure may describe "a" cation or "an" anion, a mixture of such materials or ligands can be used. When ranges are given, any endpoints of those ranges and/or numbers within those ranges can be combined within the scope of the present disclosure. The terms "including" and like terms mean "including but not limited to," unless specified to the contrary. Further, as used herein, the term "substantially" is used as a term of approximation and not as a term of degree, and is intended to account for normal variations and deviations in the measurement or assessment of various parameters of the complexes and compositions (e.g., in the description of physical or chemical properties of various components and in the description of amounts of various components).

Notwithstanding that the numerical ranges and parameters set forth herein may be approximations, numerical values set forth in the Examples are reported as precisely as is practical. Any numerical value, however, inherently contains certain errors necessarily resulting from the standard variation found in their respective testing measurements. The word "comprising" and variations thereof as used in this description and in the claims do not limit the disclosure to exclude any variants or additions.

What is claimed is:

1. A thin film for an optoelectronic device, the thin film comprising a layered 2D perovskite material comprising two or more inorganic perovskite layers, the thin film comprising the layered 2D perovskite material comprising a substantially single-crystalline uniform thin film, the layered 2D perovskite material being represented by $(BA)_2(MA)_{n-1}Pb_nI_{3n+1}$, wherein BA is an n-butyl ammonium cation and MA is a methyl ammonium cation.

2. The thin film of claim 1, wherein n is 3 or 4.

3. The thin film of claim 1, wherein the thin film has a thickness of 100 nm to 900 nm.

4. An optoelectronic device comprising:

a substrate layer, a thin film including a layered 2D perovskite on the substrate layer, the layered 2D perovskite comprising two or more inorganic perovskite layers, and the thin film comprising a substantially single-crystalline uniform thin film, the layered 2D perovskite being represented by $(BA)_2(MA)_{n-1}Pb_nI_{3n+1}$, wherein BA is an n-butyl ammonium cation and MA is a methyl ammonium cation, and a second electrode on the thin film.

5. The optoelectronic device of claim 4, further comprising an electron transport layer.

6. The optoelectronic device of claim 4, further comprising an encapsulation layer.

7. The optoelectronic device of claim 4, wherein the optoelectronic device is a photovoltaic device, a solar cell, a LED, a LASER, an electrically injected LASER, a photo or charge particle detector, or a field effect transistor.

* * * * *